United States Patent
Perkins

(10) Patent No.: US 10,855,221 B2
(45) Date of Patent: Dec. 1, 2020

(54) SOLAR THERMAL COLLECTOR

(71) Applicant: Trac Group Holdings Ltd, Southport (AU)

(72) Inventor: Jason Dean Perkins, Surfers Paradise (AU)

(73) Assignee: TRAC GROUP HOLDINGS LTD, Southport (AU)

( * ) Notice: Subject to any disclaimer, the term of this patent is extended or adjusted under 35 U.S.C. 154(b) by 60 days.

(21) Appl. No.: 15/766,490

(22) PCT Filed: Oct. 6, 2015

(86) PCT No.: PCT/AU2015/050604
§ 371 (c)(1),
(2) Date: Apr. 6, 2018

(87) PCT Pub. No.: WO2017/059474
PCT Pub. Date: Apr. 13, 2017

(65) Prior Publication Data
US 2019/0058440 A1  Feb. 21, 2019

(51) Int. Cl.
*H01L 31/042* (2014.01)
*H02S 40/44* (2014.01)
(Continued)

(52) U.S. Cl.
CPC ............ *H02S 40/44* (2014.12); *E04D 1/2916* (2019.08); *E04D 1/2956* (2019.08);
(Continued)

(58) Field of Classification Search
CPC .......... E04D 1/2956; E04D 2001/3455; E04D 2001/3417; E04D 12/004; E04D 1/2916;
(Continued)

(56) References Cited

U.S. PATENT DOCUMENTS 3,076,450 A * 2/1963 Gough .................. F24S 80/457
126/672
3,869,199 A * 3/1975 Cummings ............. F24S 23/00
126/651
(Continued)

FOREIGN PATENT DOCUMENTS

AU  1621676 A  1/1978
AU  4054078 A  4/1980
(Continued)

OTHER PUBLICATIONS

International Search Report issued in International Application No. PCT/AU2015/050604; dated Feb. 8, 2016, 7 pages.

*Primary Examiner* — Golam Mowla
(74) *Attorney, Agent, or Firm* — Meunier Carlin & Curfman LLC

(57) ABSTRACT

There is provided a cladding member (13) formed of a supporting body portion (67) having mounts (54) and a head portion (12), and an absorber surface portion (70) having a peripheral boundary wall (71) defining a recess into which a solar cell array (removed in this view for clarity) is bonded. The supporting (67) and absorber surface (70) body portions are pressure moulded from polyvinyl ester/glassfibre (30%)/fire retardant (40%)/pigment sheet moulding compound. Complementary bonding portions (72) form a glue line in assembly and have complementary water passages (73) defined therebetween. The bonding portions (72) contrive a generally sinusoidal glue space (74) that is longer that the transverse sectional dimension of the boding portions (72), cooperating with the adhesive system to resist water pressure in the passages (73).

35 Claims, 28 Drawing Sheets

(51) Int. Cl.

| | | |
|---|---|---|
| *F24S 10/50* | (2018.01) | |
| *F24S 20/67* | (2018.01) | |
| *H02S 40/42* | (2014.01) | |
| *H02S 20/23* | (2014.01) | |
| *E04D 12/00* | (2006.01) | |
| *E04D 1/00* | (2006.01) | |
| *F24S 25/60* | (2018.01) | |
| *E04D 1/34* | (2006.01) | |
| *E04D 1/20* | (2006.01) | |

(52) U.S. Cl.
 CPC ............ E04D 12/004 (2013.01); F24S 10/50 (2018.05); F24S 10/501 (2018.05); F24S 20/67 (2018.05); H01L 31/042 (2013.01); H02S 20/23 (2014.12); H02S 40/425 (2014.12); *E04D 1/20* (2013.01); *E04D 2001/3417* (2013.01); *E04D 2001/3423* (2013.01); *E04D 2001/3447* (2013.01); *E04D 2001/3455* (2013.01); *F24S 2025/601* (2018.05); *F24S 2025/6007* (2018.05); *Y02B 10/12* (2013.01); *Y02B 10/20* (2013.01); *Y02E 10/44* (2013.01); *Y02E 10/50* (2013.01); *Y02E 10/60* (2013.01)

(58) Field of Classification Search
 CPC .............. E04D 2001/3423; E04D 1/20; E04D 2001/3447; F24S 2025/6007; F24S 10/50; F24S 20/67; F24S 10/501; F24S 2025/601; H01L 31/042; Y02B 10/12; Y02B 10/20; H02S 20/23; H02S 40/425; H02S 40/44; Y02E 10/60; Y02E 10/44; Y02E 10/50
 See application file for complete search history.

(56) References Cited

U.S. PATENT DOCUMENTS

| | | | | |
|---|---|---|---|---|
| 3,916,871 A | * | 11/1975 | Estes ........................ | F24S 80/30 126/666 |
| 3,952,724 A | * | 4/1976 | Pei ........................... | F24S 10/45 126/655 |
| 3,961,619 A | * | 6/1976 | Estes ........................ | F24S 80/30 126/666 |
| 3,965,887 A | * | 6/1976 | Gramer ................... | F24S 10/503 126/666 |
| 3,977,601 A | * | 8/1976 | Bearzi ...................... | F24S 50/40 126/586 |
| 4,002,160 A | * | 1/1977 | Mather, Jr. .............. | F24S 10/45 126/655 |
| 4,007,729 A | * | 2/1977 | Chao ........................ | F24S 10/72 126/646 |
| 4,008,708 A | * | 2/1977 | Hagarty ................... | B32B 25/20 126/668 |
| 4,013,062 A | * | 3/1977 | Laird ....................... | F24S 10/755 126/658 |
| 4,033,325 A | * | 7/1977 | Walker ..................... | F24S 90/10 126/638 |
| 4,048,982 A | * | 9/1977 | Pei ........................... | F24S 23/71 126/676 |
| 4,228,851 A | | 10/1980 | LaBarge et al. | |
| 4,240,407 A | * | 12/1980 | Spencer ................... | F24S 10/503 126/668 |
| 4,292,955 A | * | 10/1981 | Smith ...................... | F24S 10/503 126/666 |
| 7,748,191 B2 | * | 7/2010 | Podirsky .................. | E04D 1/30 52/536 |
| 8,196,367 B2 | * | 6/2012 | De Bray ................... | E04D 1/34 52/489.2 |
| 2011/0186109 A1 | * | 8/2011 | Elazari ..................... | H02S 40/44 136/248 |
| 2011/0247282 A1 | | 10/2011 | Bankart | |
| 2012/0234313 A1 | * | 9/2012 | Rostami ................... | F24S 80/30 126/652 |
| 2012/0279493 A1 | | 11/2012 | Dotan | |
| 2012/0312295 A1 | * | 12/2012 | Conley ..................... | F24S 10/72 126/652 |
| 2013/0333310 A1 | | 12/2013 | Damo | |

FOREIGN PATENT DOCUMENTS

| | | |
|---|---|---|
| AU | 2002249000 B2 | 9/2006 |
| DE | 19546100 A1 | 6/1997 |
| DE | 20313564 U1 | 11/2003 |
| EP | 0321351 A1 | 6/1989 |
| FR | 2468855 A | 5/1981 |
| GB | 2045423 A | 10/1980 |
| JP | S5680563 A | 7/1981 |
| JP | H066599A A | 1/1994 |
| WO | 2008037016 A1 | 4/2008 |
| WO | 2014128183 A1 | 8/2014 |
| WO | 2017059474 A1 | 4/2017 |

\* cited by examiner

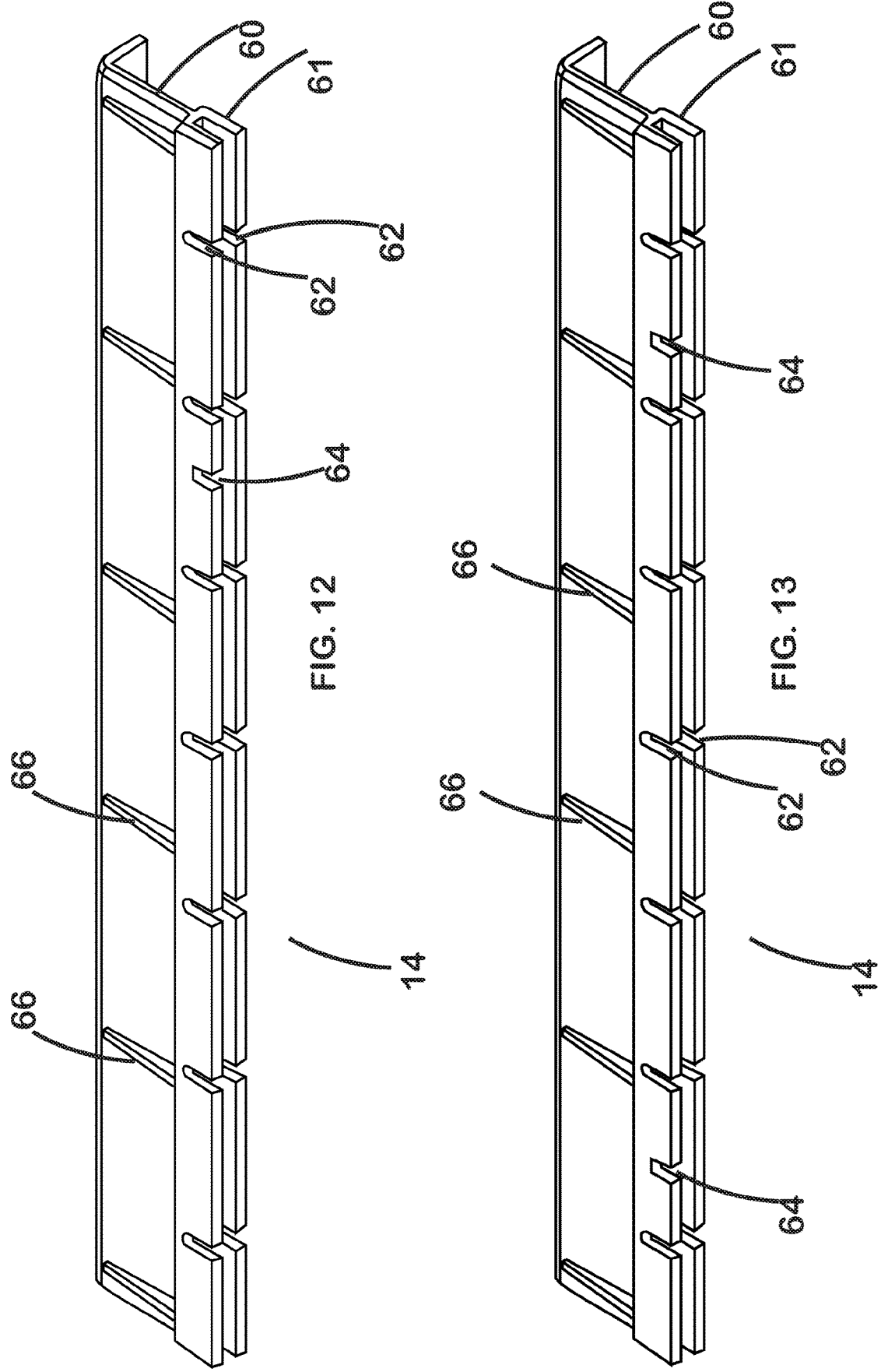

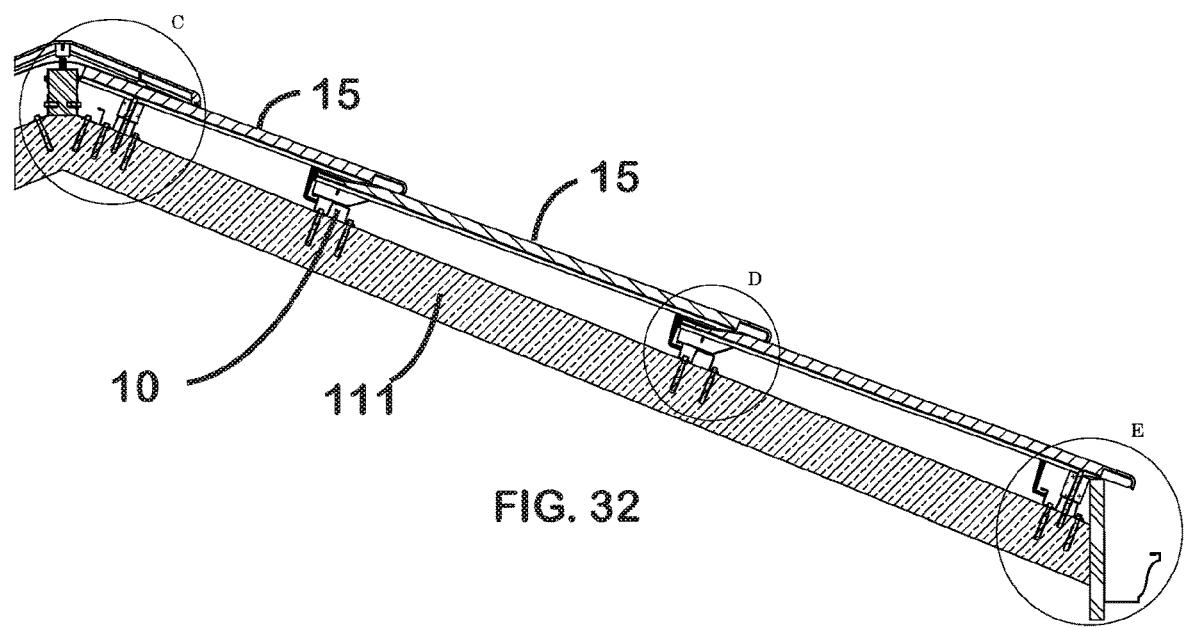
FIG. 32
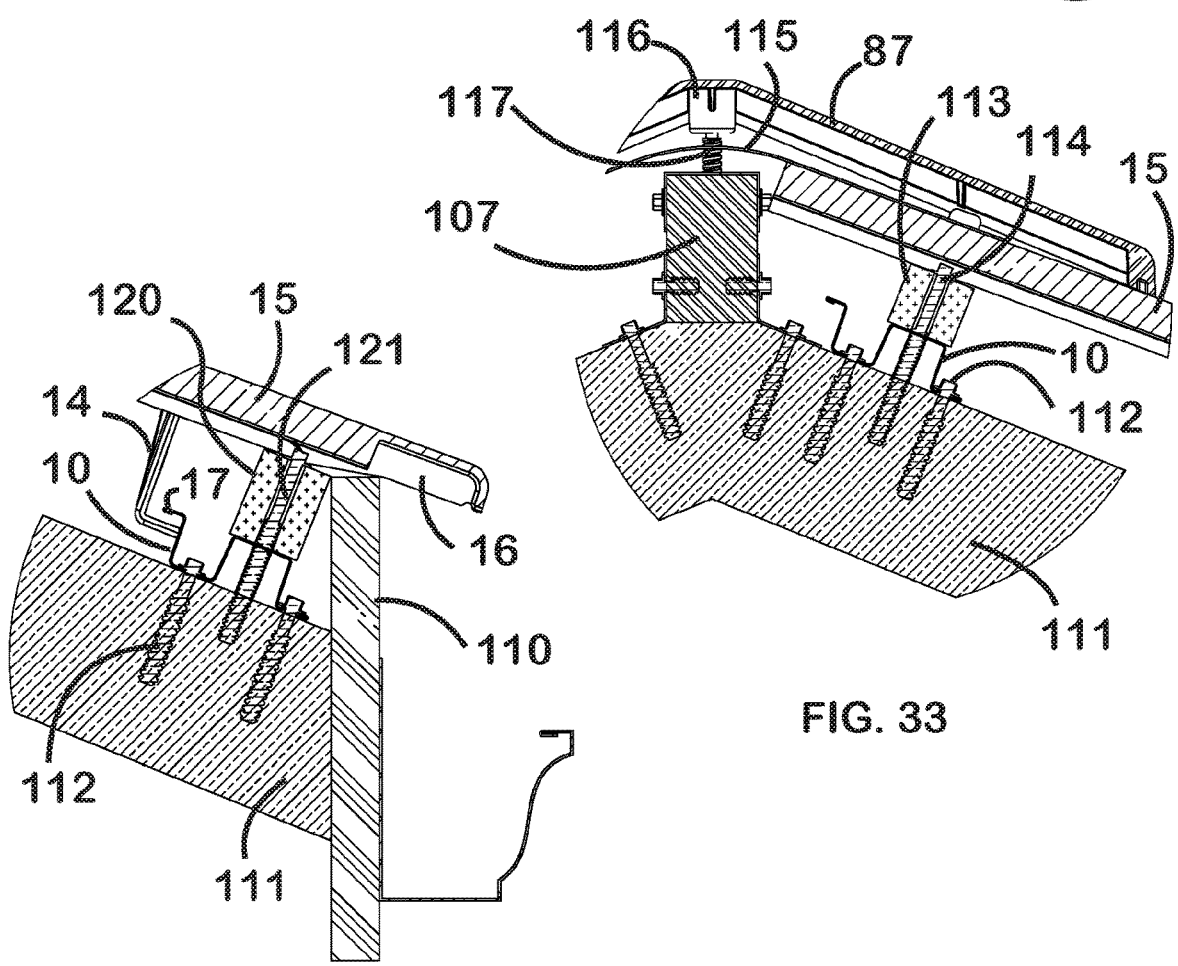
FIG. 33
FIG. 34

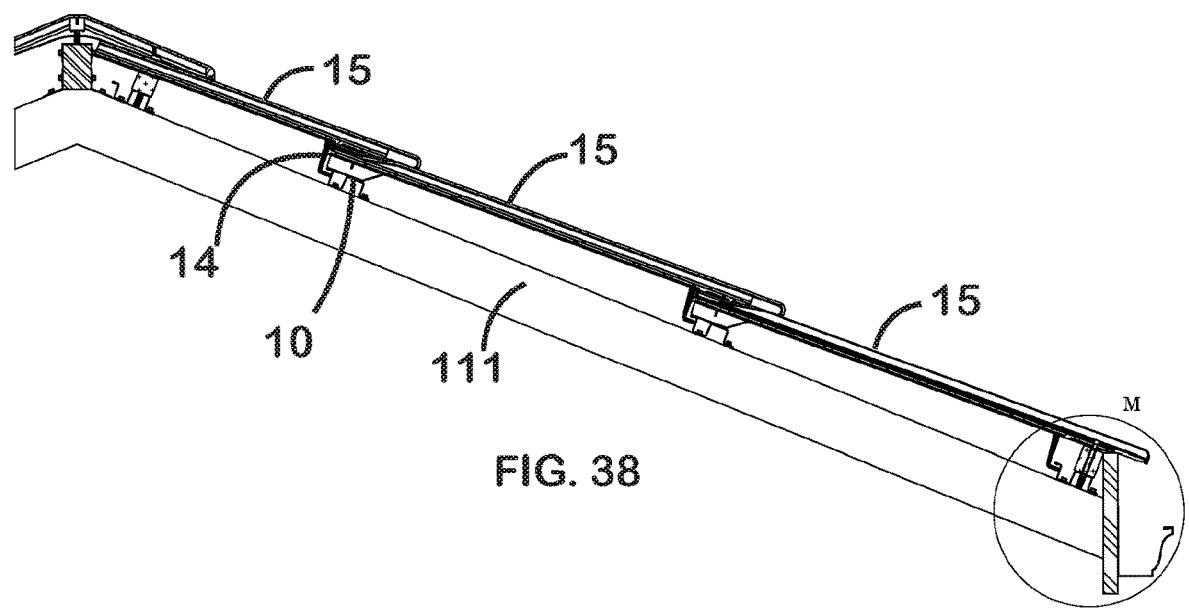
FIG. 38
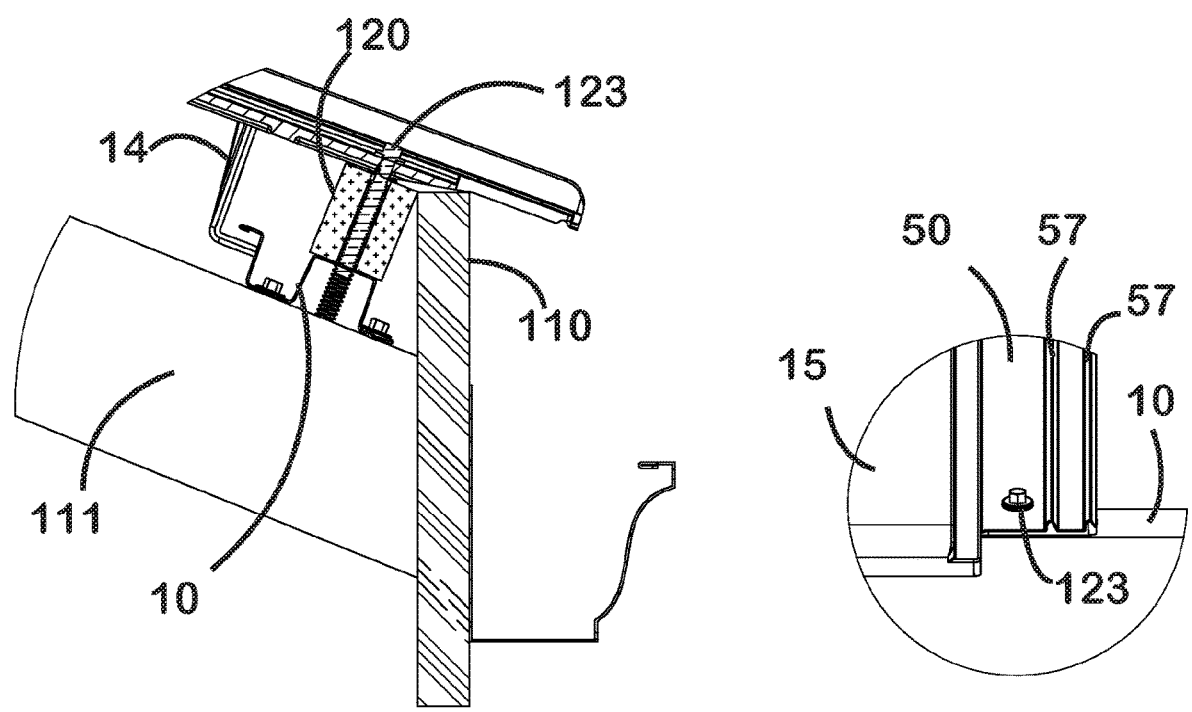
FIG. 39
FIG. 40

SOLAR THERMAL COLLECTOR

FIELD OF THE INVENTION

The present invention relates to a solar thermal collector, energy systems including the apparatus and methods of harvesting solar energy utilizing the apparatus. This invention has particular application to solar energy harvesting systems for domestic and industrial roofing, wall and floor cladding use, and for illustrative purposes the invention will be further described with reference to this application.

PRIOR ART

The following examples of prior art apparatus are mere public knowledge are not to be construed as forming part of the common general knowledge in the art.

It has been recognized that there may be advantage in overall energy harvesting efficiency in capturing the heat energy inherent in the incident solar radiation, with or without concurrent solar PV elements.

In WO 2002/053990 there is provided a monolithic transparent plastic body (1) having what is termed an "optical waveguide" (10), essentially a window to provide a skylight. Encapsulated in the transparent body (1) is void space forming a coil (2) for the circulation of a heat transfer fluid. PV cells (6) are embedded in the body (1) beneath the coil (2) relative to the solar-exposed front face (5) of the body. A lower surface of the body (1) is shaped to allow for internal reflection of light passing through the front face (5) into the body (1).

The construction is theoretical in that no material for the body is specified. However, in a generic moulded clear plastic material in which the photovoltaic (PV) cells (6) are suspended in spaced relation to the coil (2), there is no efficient thermal connection between the photovoltaic element and the thermal absorber. There is no explicitly described thermal contact between the PV cells (6) and the coil (2) through the transparent material. Clear plastic is normally a thermally insulating material. The PV cells (6) are spaced from the coil (2) which is a substantially thermally isolating configuration.

In WO 2008/037016 there is described a solar energy harvesting apparatus including a body supporting a solar energy harvesting thermal absorber comprising a moulded plastic absorber body, a photovoltaic element thermally bonded to the thermal absorber, a mounting for engaging the body with a substrate, a connector selected to integrate the thermal absorber functionally with other solar energy harvesting apparatus to form a solar hot water system, and an electrical connector to the photovoltaic element, the body including a transparent front face enclosing both the absorber and photovoltaic element, wherein the thermal absorber is configured to thermally absorb broadband solar radiation. The described embodiment includes a clear polycarbonate body (21) including a transparent front face (23) and supporting a thermal absorber (27) adapted to absorb incident solar radiation. The thermal absorber (27) transfers heat via a fluid connector (28) to a circulated-fluid system and in addition controls the temperature of a photovoltaic element (24) mounted on the absorber (27) and connected to an electrical harness by electrical connectors (25, 26). The polycarbonate body (21) has complementary edge mating profiles (32, 33) engaging with a standard-tiled roof structure to replace some of the standard tiles thereof, and is secured conventionally to roof battens by a batten screw (29).

The transparent housing mounts the components and integrates the components with a roof structure, but does not otherwise contribute functionally, that is, in harvesting heat and photovoltaic energy. While it may be said that the transparent front face admits visible light and other incident solar radiation, it is also a window for re-radiation losses. The housing traps an air space that may be subject to condensation; while complete sealing is a possibility the number of necessary penetrations tends to interfere with this object.

The prior art systems suffer from various degrees from being formed of a collocation of disparate systems. Where the object is solar thermal, absorbers are poorly integrated with structure, and especially so where the absorbers are mains-pressurized. Where the object is solar-PV, the solar cells are poorly integrated with roof or wall cladding. Where the object is roof or wall cladding incorporating elements of solar thermal, solar PV or both, integration of the various elements with the underlying structure is poor.

INVENTION

In a first aspect the present invention resides broadly in a solar thermal collector of the type including a collector body having an absorber surface adapted to be exposed to sunlight and be heated thereby and a having a liquid flow passage therethough adjacent said absorber surface, characterized in that said collector body is formed of body portions adhesively bonded together at two or more sets of complementary bonding surface portions with spaces between said sets, a substantially continuous said liquid flow passage being defined in adjacent surfaces of said body portions in said spaces, said bonding surface portions having complementary surface profiles selected to provide a bond section across said bonding portion which is longer than the width of said bonding surface portion.

The collector body may be formed of two complementary body portions, although it is envisaged that there may be more than two. The body portions may be formed of the same or different of any suitable material including but not limited to metal, glass, plastic or ceramic. Where one or the other body portion is of metal, it may be pressed, cast and/or machined. Where one or the other is of a plastic material this may comprise thermoset or thermoplastic polymer matrix material, either homogenous or as a composite. Composites may be laid up composites or blends. For example, the composites may be delivered as sheet or bulk moulding compounds.

The body portions may comprise a supporting body portion adapted to be mounted on a structure and an absorber surface body portion. Alternatively the body portions may comprise in assembly an absorber panel adapted to be integrated into a structure with ancillary components.

The liquid flow passage may comprise a series of parallel-flow passage portions interconnected at respective inlet and outlet ends by a header passage portion. The inlet and outlet header portion may each terminate by a respective inlet or outlet assembly adapted to connect the liquid flow passage to a coolant circuit and/or adjacent solar thermal collectors. The liquid flow passage may comprise a "series" flow passage comprising a continuous, coiled or sinuous (sigmoidal) flow passage extending from a respective inlet or outlet assembly adapted to connect the liquid flow passage to a coolant circuit and/or adjacent solar thermal collectors.

In apparatus in accordance with the present invention, the flow passage is preferably of a flattened cross section, whereby the transverse cross section of the flow passage has a dimension parallel to the absorber surface greater than the dimension perpendicular to the absorber surface. The passage cross section may be any shape including but not limited to a flattened oval, rectilinear or flattened lemon shape. The passage may be formed by forming a passage-shaped recess in one of the body portions, or may be formed in part in each of the body portions.

The use of the bonding features of the present invention allows the use of passage cross sections of not less than 3:1 parallel dimension:perpendicular dimension in a mains pressure installation.

The two or more sets of complementary bonding surface portions define spaces in which the passages are formed. The particular feature of the bonding surface portions having complementary surface profiles selected to provide a bond section across the bonding portion which is longer than the width of said bonding surface portion, provides for a bonding strength that will resist mains pressure in the passages. This feature finds particular utility when used in conjunction with one or more polymer or polymer composite body portions, and the invention will be further described with reference to this application.

The polymer body portions may be precision injection moulded of a polymer composite comprising a polymer matrix and a fibre reinforcing component. Alternatively the body portions may be pressure formed from BMC or SMC.

The polymer may be a relatively good thermal conductor such as polyphenylene sulphide, although severe processing conditions and expense of this polymer may rule it out. Accordingly, the polymer composite may include a thermally conductive reinforcing fibre such as mineral fibre, carbon fibre or graphite. The polymer matrix may also include a filler selected to enhance the thermal conductivity of the polymer composite, such as powdered aluminium.

A moulding compound may comprise sheet moulding compound (SMC). The SMC may be of any selected resin system such as vinyl ester for price, polyester, epoxy, and phenolic. The SMC may be fibre-reinforced with fibreglass, carbon fibre, polyaramid or other reinforcing. The SMC may include fillers including but not limited to one or more of talc, calcium carbonate, microspheres/balloons or other particulate material. The SMC may include flame retardant materials including but not limited to brominated-monomer flame retardant additives, hydrated alumina, hydrated super-absorbent polymer (SAP) additives and SAP/inorganic phosphate additives. The SMC may include additives to reduce shrinkage on curing.

The surface profile of the bonding portion may be selected from a plurality of parallel ridges and grooves adapted to form a labyrinth in which a bonding material may act to join the parts. The surface profile may include contact points such as lands adapted to maintain optimum bond thickness for the bonding material. The parallel ridges and grooves may be oriented substantially parallel to the flow direction in the passages. The parallel ridges and grooves in section may be any one or more of square or other shape with corners or radiused corners, or may be curved such as a polysinusoidal section.

The bonding material may be any adhesive or sealant having moderate to good peel and tensile bond strengths and resistance to attack by hot water. Examples of suitable adhesive systems include (but are not limited to) single part or two-part systems such as solvent free epoxy, polyurethane, acrylate and silicone systems. The acrylate adhesive system may comprise a two-pack methacrylate adhesive bonding system.

In the case of moulded polymer body portions, the bonding process may include surface preparation of the areas to bonded such as by solvent treatment such as MEK and/or physical abrasion to remove surface contaminants and provide a bonding key and roughen the surface to allow better 'keying' of the adhesive into the material. The adhesive system is preferably provided with precision control of adhesive dispensing quantity and compressed cross sectional area of the adhesive. The set up components and adhesives may be pressed by mechanical means or vacuum bagged to hold the parts together under pressure during the cure time of the adhesive.

The inlet and outlet assemblies may be formed in one or the other or both of the body portions. For example, the body portions may have formed therein complementary inlet and outlet mounting portions wherein inlet and outlet fittings may be bonded as the body portions are bonded together. The inlet and outlet assemblies may be configured with means to interface the apparatus in circuits, such as with quick fit and release connections such as SHARKBITE® push-fit system for PEX & copper, or barb and crimp or screw thread.

The invention may find use as a roof, floor or wall cladding. Accordingly, in a further aspect the invention resides broadly in a solar thermal cladding apparatus including:

a solar thermal collector body formed of body portions adhesively bonded together at two or more sets of complementary bonding surface portions with spaces between said sets, and having an absorber surface adapted to be exposed to sunlight and be heated thereby, said bonding surface portions having complementary surface profiles selected to provide a bond section across said bonding portion which is longer than the width of said bonding surface portion;

a substantially continuous liquid flow passage defined in adjacent surfaces of said body portions in said spaces and adjacent said absorber surface;

respective head and foot portions integrally formed at opposed edges of the collector body, the foot portion cooperating in substantially weatherproof overlap with the head portion of one or more other collector bodies installed on a structure, said head and foot portions being interconnected by respective one of opposed, complementary side edges of said collector body and forming therewith a cladding body, said complementary side edges providing substantially weatherproof interengagement between said cladding body and an adjacent said cladding body secured to said battens, one said side edge of said body overlapping a said side edge of said adjacent body and selected to finish said adjacent bodies to a substantially flush surface in use on said structure;

mounting means on an underside of said cladding body and adapted to secure said cladding body to battens on said structure; and inlet and outlet fluid connectors bonded between said body portions and fluid-connecting said passage into an external heat exchange fluid circuit.

The structure may be a roof structure, wall structure or floor structure or the like.

The collector components of the solar thermal collector body may be substantially as described above. The solar thermal collector body, head and foot portions and side edge portions may be formed of polymer composite materials as described above. The head and foot portions and the side edge portions are preferably integral with one of the collector body portions. For example the head and foot portions and the side edge portions may be formed integrally with one of the body portions and the absorber surface may form a major surface of the other of said body portions.

The substantially weatherproof overlap of the respective head and tail portions may be made by selection of the length of the overlap versus the pitch of the roof, and may be supplemented by labyrinth elements provided on one or both of the portions. The complementary side edges may comprise interengaging ridges and grooves to form a labyrinth seal. Alternative there may be provided sealing means such as a resilient sealing strip.

One or both of the head and foot portions may include a hollow space in which one or both of the inlet and outlet connectors may be led, for collection into the external heat exchange fluid circuit. For example, the head portion may be relatively thicker and open to the underside or inside of the structure, whereby the inlet and outlet connectors may be accessed after the cladding is installed.

The mounting means may take any suitable form dictated by the nature of the battens and the cladding body. For example, in the case of conventional timber battens the mounting means may comprise one or more securing clips secured to the cladding body adjacent the foot portion and adapted to be nailed or screwed to a batten supporting the head portion of the next adjacent cladding body. Such attachment is necessarily from the inside of the structure. Alternatively, substantially L-shaped members may be similarly co-located with the foot portion and pass under the batten, trapping the head portion of the next adjacent cladding body. In this embodiment, the cladding members are mutually prevented from lifting and only the last or uppermost run of the cladding members need be restrained from moving up the structure.

In a further embodiment of the present invention, there is provided a specialized battening system particularly adapted for use with the present cladding bodies and others. The batten may comprise an elongate roll formed metal or polymer composite section having a pair of upper bearing surfaces and a pair of lower bearing surfaces. Each pair of bearing surfaces may be formed by a peripheral flange and the floor of a channel. Accordingly both the top and bottom pairs of bearing surfaces may be each disposed both sides of and bounding a channel.

The batten section may be reversible, that is, with the respective upper and lower bearing surfaces identical. Alternatively, the upper and lower surfaces may be specialized.

For example, the one or both of the upper bearing surfaces may be provided with dimples or perforations to resist worker foot slip incidents in installation. The upper surface of one or more of the lower bearing portions may be provided with a screw location groove or dimple to permit the battens to be screwed to the rafters or studs.

The free edges of the peripheral flanges may be reinforced or stiffened such as by rolling the edge in the case of rolled metal sections. The batten may be given additional form stiffness by dimpling the channel edges of rolled sections.

In use the battens may be secured to the rafters or studs with the peripheral flange of the upper bearing surfaces pointing up the slope. The battens are preferably double screwed at each rafter and stud, with a screw through each of the lower peripheral flange and channel floor.

A batten engagement portion or portions may be integrally formed with or secured to the underside of the cladding body in the region of the foot portion. For example, one or more inverted-L shaped batten engagement portions may be bonded to complementary bonding portions of the cladding body underside. Engagement with the bar of the L-shape under the peripheral flange may cause the foot portion to trap the head portion of the next adjacent cladding body against the upper surfaces of the batten.

The batten engagement portions may be of any suitable material. For example the batten engagement portions may be of extruded or formed sheet metal, or polymer composite. In the case of the preferred moulded polymer composite cladding bodies, the batten engagement portions may take the form of polymer composite members adapted to click engage or be bonded to complementary mounting portions provided on the underside of the cladding body. The complementary mounting and batten engagement portions may be provided with means to ensure precise relative location of the portions. For example there may be provided complementary locating nibs and slots.

The lowermost cladding body may be spaced from the lowermost batten in a structure by a suitable spacer mimicking a head portion thickness. The foot portion may be extra secured by roof screwing through the edge from the outside, though the batten and into the stud or rafter, especially if the fixing is to be concealed. The uppermost course of cladding bodies may need to be secured without the head portion being supported in a batten. To accommodate this, there may be provided an intermediate spacer supporting the cladding on a batten located as close as possible to the head portion. The uppermost course is likely to be dressed and weatherproofed with a capping or flashing and, where necessary, the upper course may be screwed trough the cladding body with the fixing preferably concealed by the capping or flashing.

The absorber surface may have bonded thereto one or more solar PV elements. For example, the absorber face may be recessed into its body portion to neatly seat a solar array comprising at least a protective glass outer layer, an array of solar cells and conductive collectors, an insulative film backing and connection means providing termination for said collectors. It is envisaged that purpose build solar arrays may include an encapsulated lead out and/or diode pack, and the upper surface of the cladding body adjacent the head portion may be relieved to receive encapsulated lead out and/or diode pack and allow the lead out to pass into the space inside the head space.

The heat exchange capacity of the absorber surface tends to regulate the temperature-dependant characteristics of the PV elements.

The photovoltaic elements in the array may comprise any photovoltaic element that is capable of integration with a thermal absorber and be regulated as to temperature thereby. Preferably, the photovoltaic element is close thermal bonded to the absorber surface. The advantage of this is that waste heat generated by the PV cells is an additional thermal energy source. Drawing heat away from the cells in this fashion allows them to operate at lower temperatures at which they are most efficient. Cell manufactures typically rate their cells' power output at a temperature of 25-30 degrees C. In practice most cells operate well above this by reason of the combination of resistive heating and thermal absorption and so never work to their full potential. Thermally integrating the PV cell and thermal absorber/heat exchanger means that the cells may operate at a relatively constant temperature. By using the waste resistive heat and PV absorption heat to heat coolant for transfer of heat to, for example, a hot water system some advantage can be gained by reducing the power required to heat the household's hot water. The masking effect of the PV cells on the thermal absorber is ameliorated.

The photovoltaic element is therefore preferably close-thermal-bonded to the thermal absorber. The interface between the photo-active portions of the photovoltaic element and the thermal absorber may be selected to reflect solar radiation at least substantially over the absorption bandwidth of the photovoltaic element. By this means the photoactive material may interact with reflected photons of sufficient energy that have passed through the material on incidence.

The modular nature of the cladding elements provides the option of using a broad range of solar cell technology such as: poly or mono crystalline photovoltaic (PV) elements including sliver cells; amorphous PV elements; and chemical dye artificial photosynthesis (such as DYESOL® products).

A clad structure may form a solar energy harvesting system comprising a plurality of the solar thermal cladding apparatus or solar thermal-PV cladding apparatus described above. The PV function may be parallel connected to form a low voltage system or may be series connected to feed a rated high voltage DC to AC inverter direct feeding the grid or storage. The lead outs may be connected electrically by solar power connectors rated for the purpose.

The circulated-fluid system may involve the use of a thermally massive heat exchange liquid. The liquid may be any suitable heat exchange liquid including aqueous, oleaginous or glycolic liquids. The coolant circuit may be a mains pressure system or a closed circuit heat exchange system. For example, there may be provided a header tank heated by thermosiphon or a lower tank which is heated by the system via a thermostatically controlled pump.

An apparatus as described when used as cladding may or may not comprise the whole or part of the clad surface. It is accordingly desirable to provide a family of related components to provide a cladding system, including PV-only roofing, passive roofing elements, ridge and barge cappings and the like.

In a further aspect the present invention resides in a cladding system for a wall, floor or sloping roof structure and including:
  spaced battens each comprising an elongate section having a pair of cladding bearing surfaces and a pair of structure bearing surfaces, each pair of bearing surfaces being formed by a peripheral flange and the floor of a channel respectively and being disposed to respective sides of and bounding a said channel, the peripheral flange of the cladding bearing surfaces being directed up the slope of a roof or up a wall; and
  a plurality of cladding members each having a body portion, a head lap portion and a tail lap portion and adapted to be laid in substantially weatherproof array in courses, whereby the tail laps of an upper course overlaps the head lap of the next lower course, the body portion having an inner surface adjacent the structure in use and an exposed outer surface, said inner surface mounting a batten engaging portion of generally inverted-L section adapted in use to engage under the peripheral flange of the cladding bearing surface.

The battens may be of any suitable section included but not limited to roll formed steel or aluminium section, extruded aluminium section or polymer composite. One or both of the upper bearing surfaces may be provided with a slip-resistant surface or perforations to resist worker foot slip incidents in installation. The structure bearing surface portions may be provided with a screw location groove or dimple to permit the battens to be screwed to trusses, joists, rafters or studs.

In the case of metal sections and particularly rolled metal sections, the free edges of the peripheral flanges may be reinforced or stiffened such as by rolling the edge. The rolled metal battens may be given additional form stiffness by dimpling the channel edges of rolled sections.

The cladding members may be a solar thermal or solar thermal/PV cladding elements as described above, or may comprise a plain tile or a solar PV only element. The cladding element may comprise a unitary moulded polymer structure. In one embodiment of the present invention the cladding members comprise a plurality of unitary moulded FRP cladding members.

The FRP may be in the form of an SMC compound formulation that incorporates fillers and fire retardant as described above for the solar thermal body parts.

The cladding members may comprise a plain or coated exposed outer surface. The coating system may be selected to provide colour and UV protection. A wide variety of coating systems can be used including but not limited to polyurethane based paint systems, epoxy based paint systems, and water based paint systems.

In order that a polymer or FRP cladding member may combine stiffness with light weight, the cladding members may be moulded with an egg-crate topography on the inner surface. The topography may comprise a rectilinear grid of webs each standing substantially perpendicular to the inner surface.

The batten engagement portion or portions may be integrally formed with or secured to the underside of the cladding body in the region of the foot portion. For example, one or more inverted-L shaped batten engagement portions may be bonded to complementary bonding portions of the cladding body inner surface. Engagement with the bar of the L-shape under the peripheral flange may cause the foot portion to trap the head portion of the next adjacent cladding body against the upper surfaces of the batten.

The batten engagement portions may be of any suitable material. For example the batten engagement portions may be of extruded or formed sheet metal, or polymer composite. In the case of the moulded polymer or FRP composite cladding bodies, the batten engagement portions may take the form of polymer composite members adapted to click engage or be bonded to complementary mounting portions provided on the underside of the cladding body. In the case of the egg-crate configured inner surfaces, the complementary mounting portion may comprise one or more of the webs. The complementary mounting and batten engagement portions may be provided with means to ensure precise relative location of the portions. For example there may be provided complementary locating nibs and slots.

Cladding systems in accordance with the present invention may be associated with ancillary parts such as valleys, ridge cappings, barge boards and the like.

BRIEF DESCRIPTION OF DRAWINGS

The invention will now be described in more detail according to a preferred but non-limiting embodiment and with reference to the accompanying illustrations wherein:

FIGS. 12 and 13 are isometric views of two differently-keyed batten engagement members for use in conjunction with cladding members of the system of FIG. 1;

FIG. 32 is a section through a roof cladding illustrating the installation method and indicating Details C, D and E;

FIG. 33 is the Detail C of FIG. 32;

FIG. 34 is the Detail E of FIG. 32;

FIG. 38 is a section through a roof cladding illustrating the installation method and indicating Detail M;

FIG. 39 is a fixing detail of FIG. 38;

FIG. 40 is the Detail N from FIG. 30; and

DESCRIPTION OF THE EMBODIMENT

Figure 1:
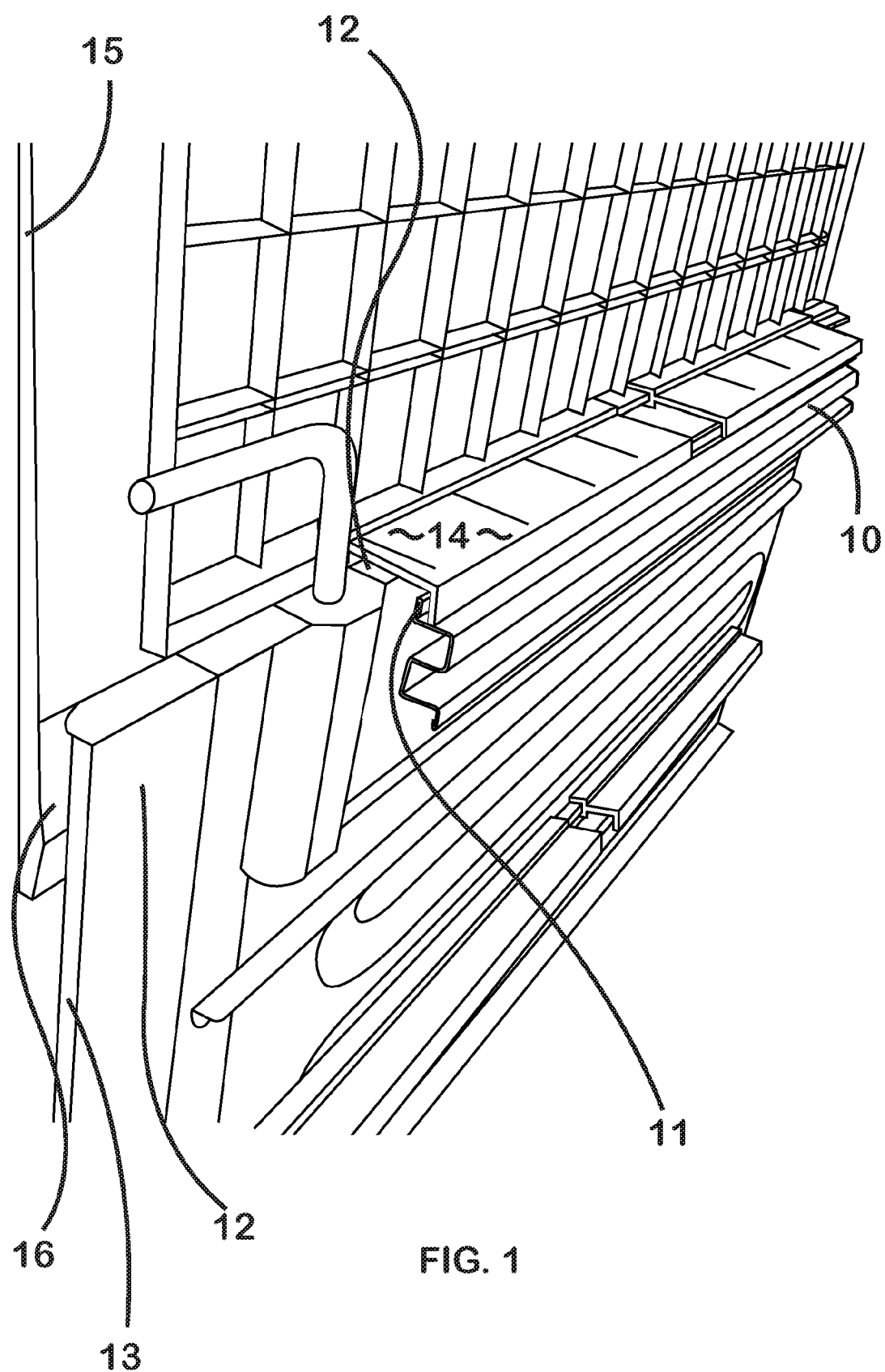
FIG. 1 shows the underside of a typical cladding system in accordance with the present invention.
Figure 2:
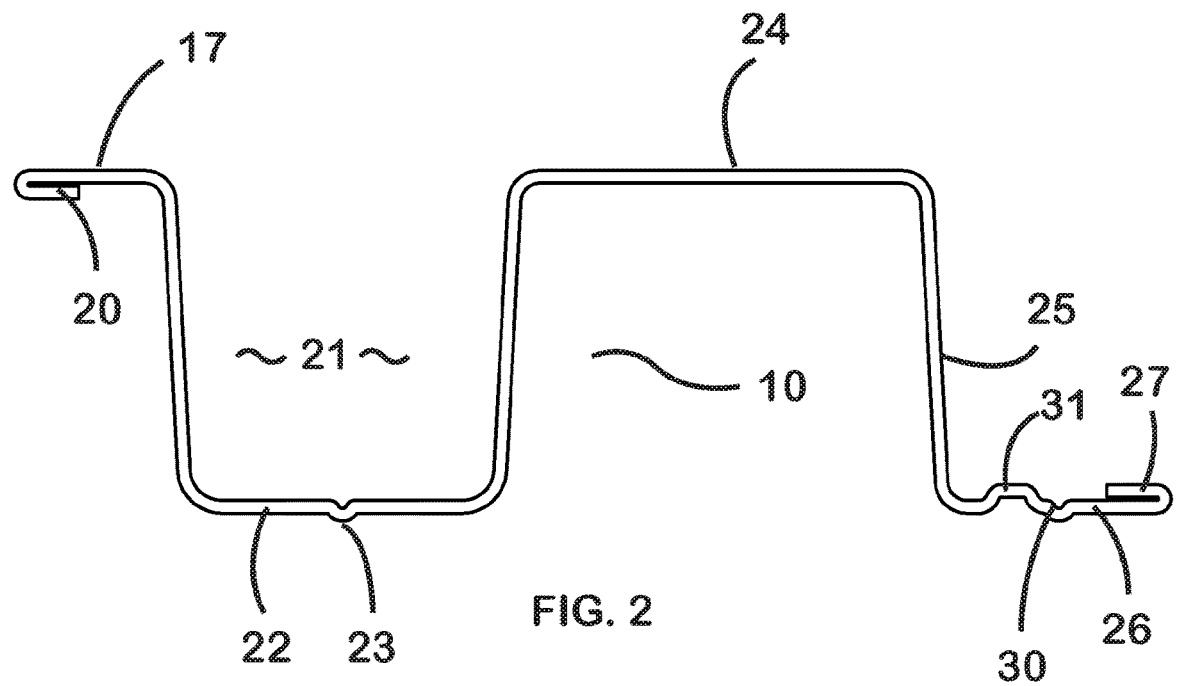
FIG. 2 is a section of a batten for use in the system of FIG. 1.
Figure 3:
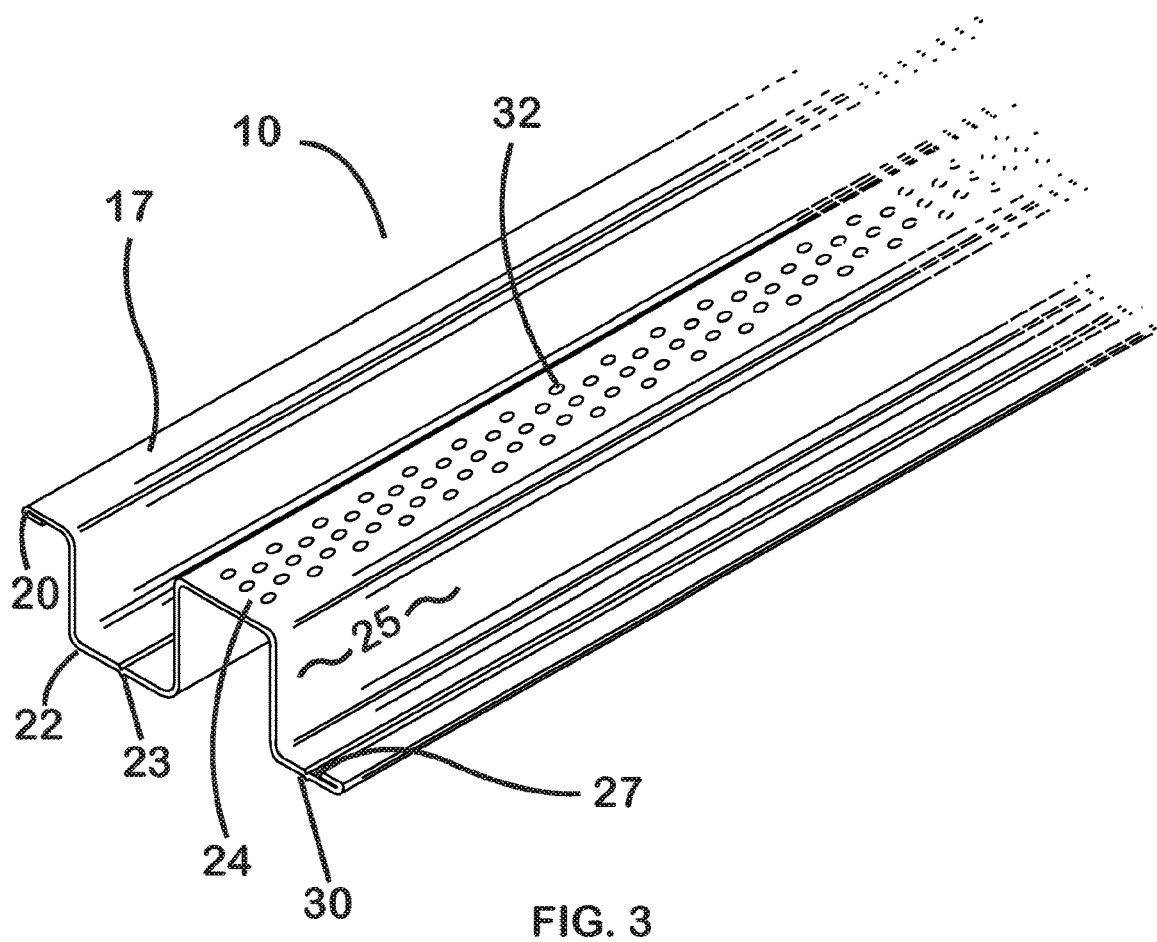
FIG. 3 is an isometric view of the batten of FIG. 2.

In FIG. 1 there is a generalized impression of a cladding system embodying one example of the present invention and wherein a rolled steel batten 10 is shown as if lifted straight off a roof structure. The batten 10 has an up-slope flange 11 adapted to be entrapped between an overlying head portion 12 of a solar thermal cladding member 13 and a batten engaging portion 14 of a plain cladding member 15. A tail lap portion 16 of the plain cladding member 15 overlies the head portion 12 to weatherproof the structure.

In FIGS. 2 to 5 there is illustrated two different embodiments of the batten 10, and wherein like features are numbered the same in each embodiment. The batten 10 is roll formed from anodically treated steel such as zinc-aluminium coated steel. The batten 10 has an upper flange 17 terminated by a rolled edge 20, and bounded at its inner edge by a channel 21. The channel 21 has a floor 22 having rolled therein a screw locating groove 23. The channel 21 is bounded opposite the upper flange 17 by an upper bearing portion 24, which is then turned down into web 25, and terminated by a lower flange 26 having a rolled terminal edge 27. A second screw groove 30 is provided, and a stiffening ridge 31 is rolled in between the screw groove 30 and the web 25. The upper surface of the bearing portion 24 is provide with a non-slip dimpling 32.

Figure 4:
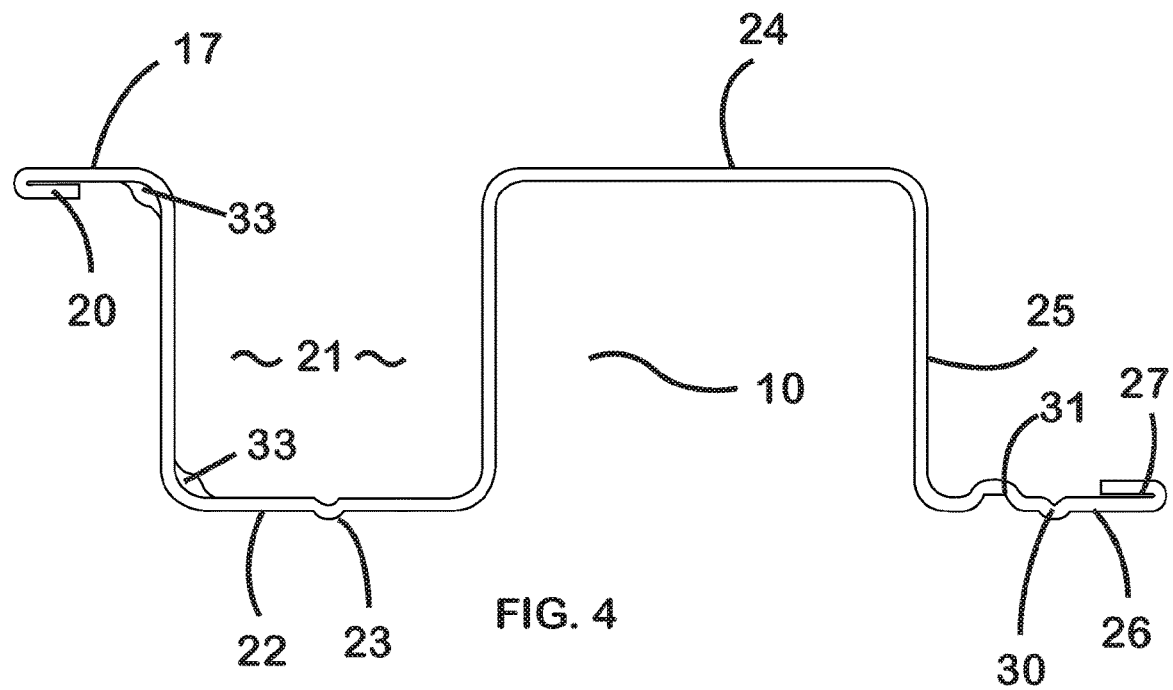
FIG. 4 is a section of an alternate batten for use in the system of FIG. 1.
Figure 5:
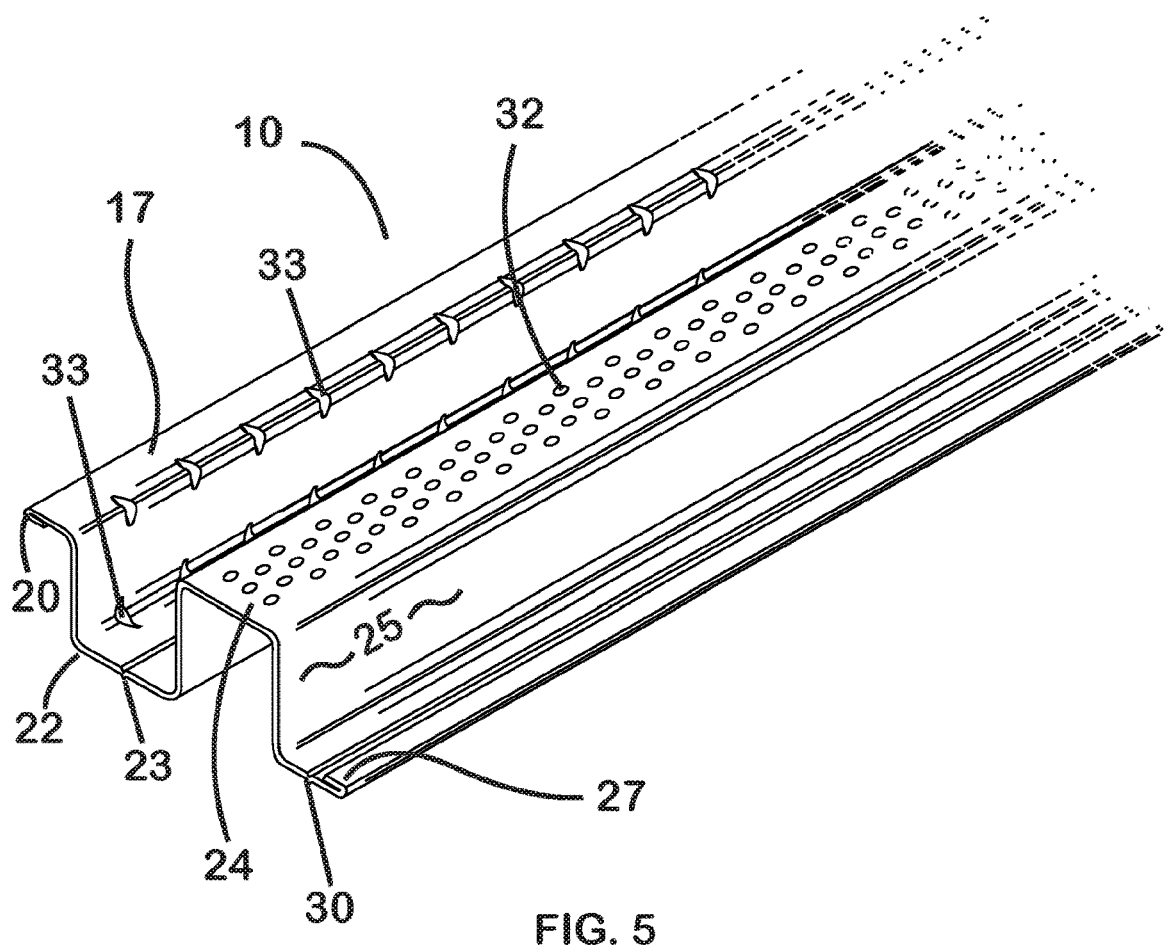
FIG. 5 is an isometric view of the batten of FIG. 4.

In the embodiment of FIGS. 4 and 5, there is provided additional form stiffness to the batten by the use of periodic creasing 33 of the upper flange 17 to channel 21 turn and the channel 21 turn to the floor 22.

Figure 6:
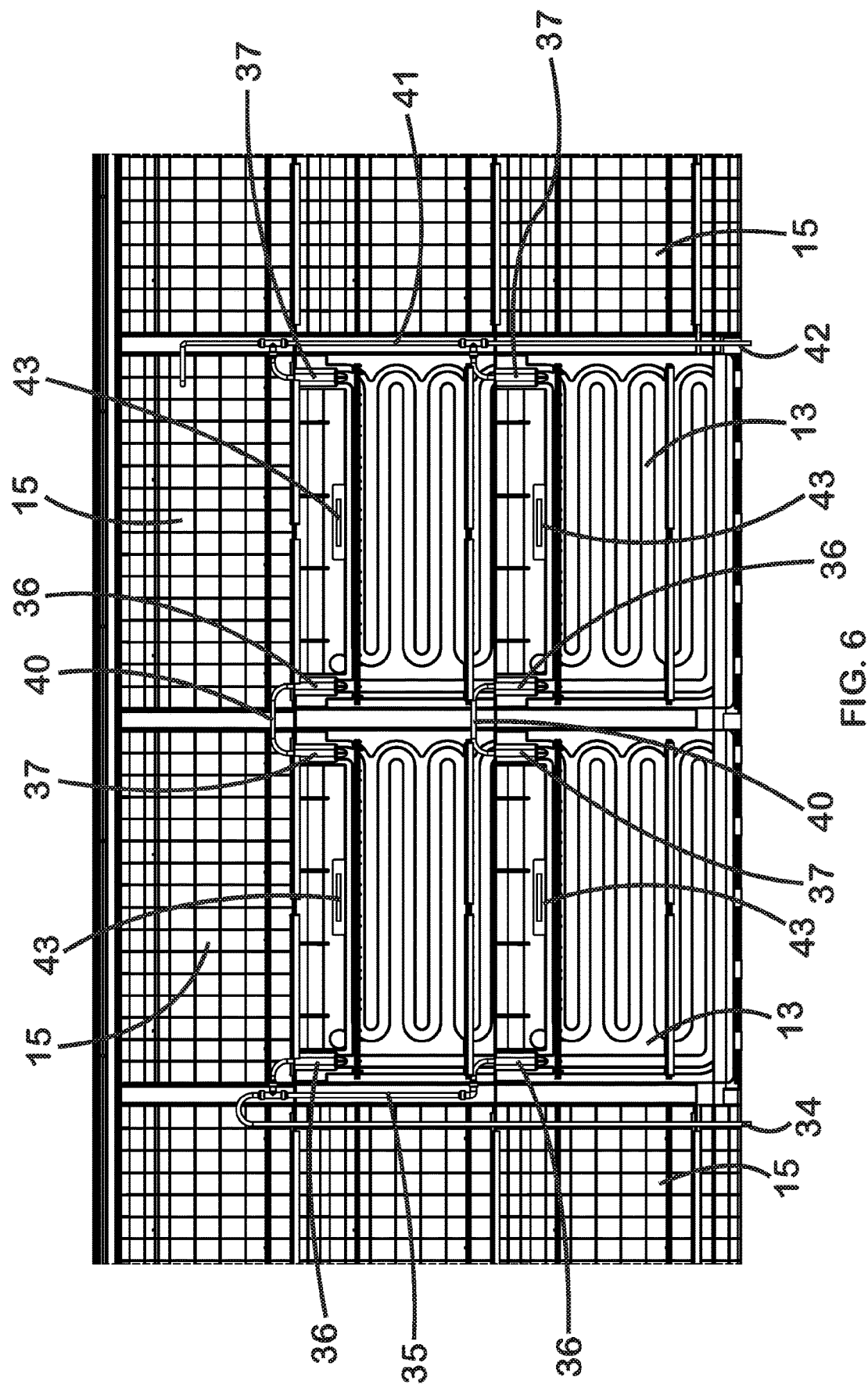
FIG. 6 is a detail view from beneath of the system of FIG. 1.

In FIG. 6 there is illustrated a cladding system of multiple reinforced polymer solar thermal cladding members 13 and multiple plain cladding members 15, with the structure and battens removed. In this illustration, it can be seen that a water inlet 34 is manifolded at 35 to feed solar thermal cladding member inlet assemblies 36. The respective cladding member outlet assemblies 37 are connected by quick connection loops 40 to the inlet assemblies 36 of adjacent solar thermal cladding members 13, and thence to their outlet assemblies 37, to be manifolded at 41 and thence to water outlet 42. By this means a combination of parallel and series connection of panels may be used.

In this embodiment, solar thermal/PV cladding members may be fitted with diode/terminal equipment located at diode mounting portion 43.

Figure 7:
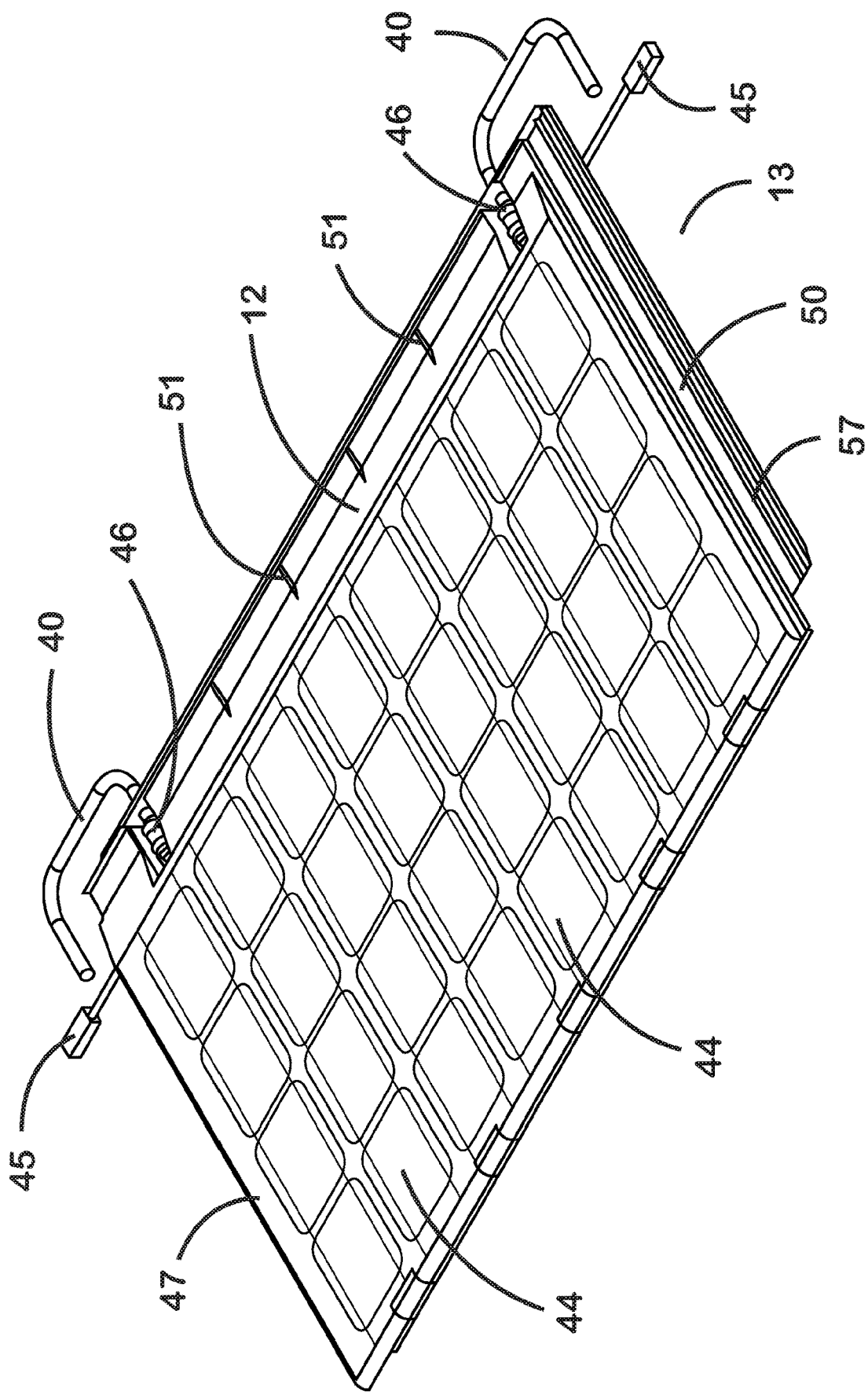
FIG. 7 is an isometric view of a solar thermal/PV cladding member for use in the system of FIG. 1.
Figure 8:
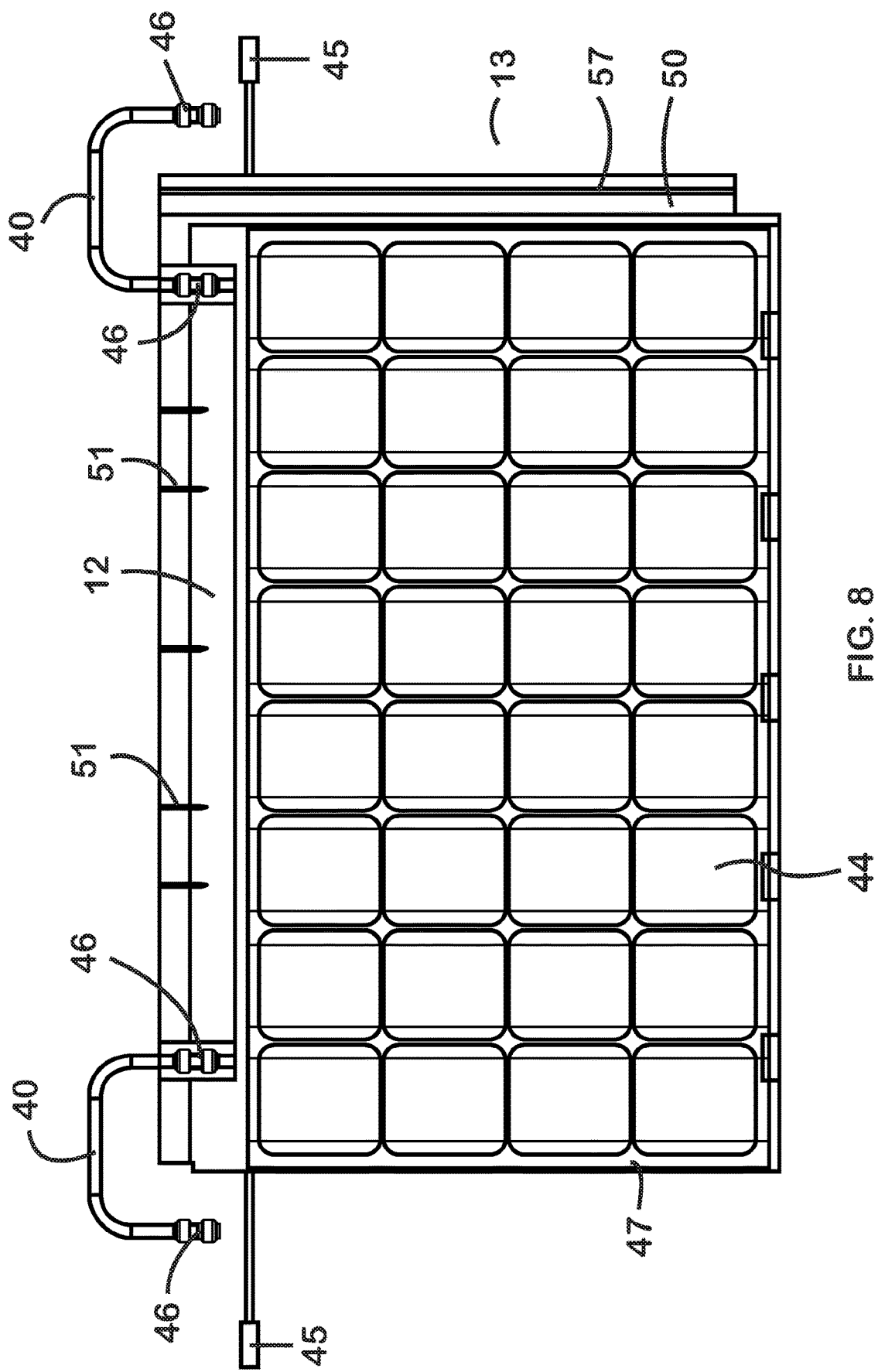
FIG. 8 is a top plan view of the cladding member of FIG. 7.

FIGS. 7 and 8 are a top perspective view and top plan view respectively of a typical solar thermal/PV cladding member 13, having solar cells 44 bonded to the upper surface of the solar thermal cladding member 13 and connected through the aforementioned diode mounting portion 43 (not shown in this view) to a wiring harness connector 45. The respective loops 40 are installed to the inlet assembly 36 (not shown) by quick fit and release coupling 46. The head portion 12 is relieved to accommodate the couplings 46, and is configured to catch any casual ingress of water under the tail portion of an overlying cladding member (13 or 15).

A side overlap portion 47 is complementary to a side underlap portion 50 to provide for weather resistant, side by side installation of adjacent cladding members (13 or 15). The detail of these portions are describe in detail hereinafter. Upper stiffening webs 51 have a dual function of form stiffening the head portion 12 and providing multiple bearing edges to support the tail portion of the next adjacent cladding member (13 or 15).

Figure 9:
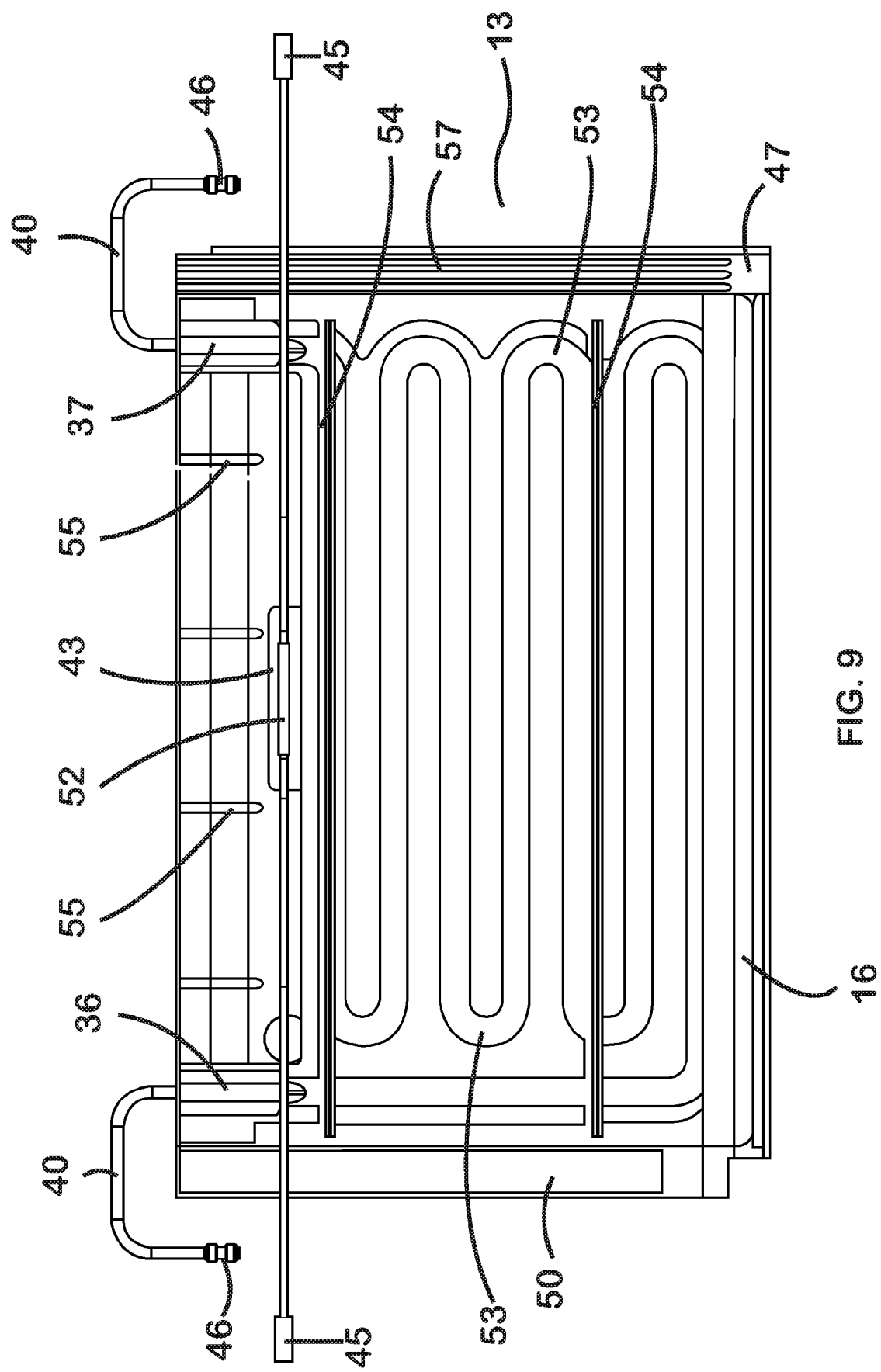
FIG. 9 is a bottom plan view of the cladding member of FIG. 7, without batten engaging members.
Figure 10:
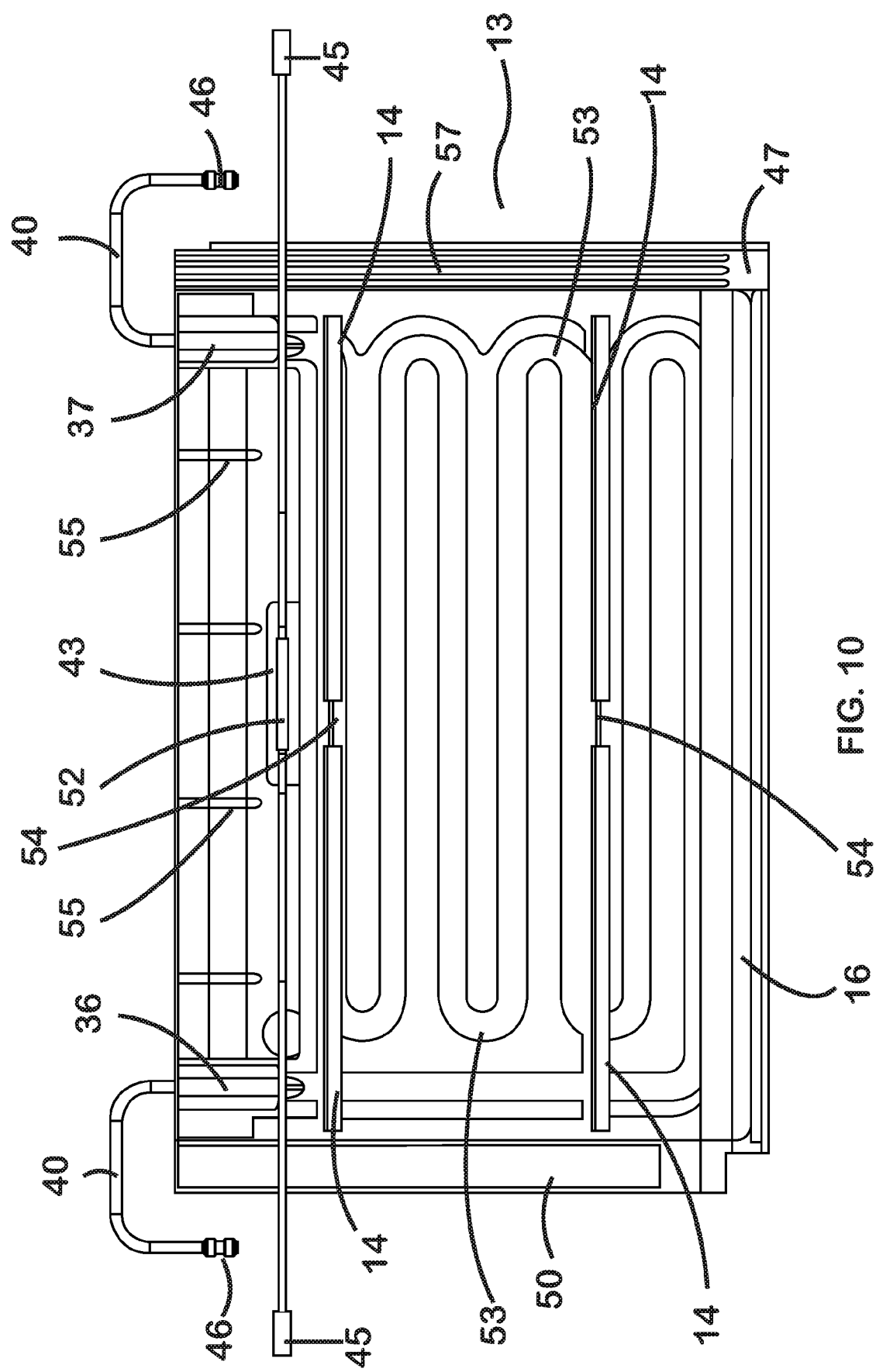
FIG. 10 is a bottom plan view of the cladding member of FIG. 7, with batten engaging members fitted.

FIGS. 9 and 10 are bottom plan views of the member illustrated in FIGS. 7 and 8 wherein the wiring harness connectors 45 are shown in circuit with a diode pack 52 occupying the diode mounting portion 43. The outline of a sigmoidal water passage (described in detail hereinafter) is represented by a flattened sigmoidal ridge 53 traced out on the underside of the member 13 between the inlet assembly 36 and the outlet assembly 37.

Integral batten engagement portion mounts 54 are formed on the underside of the member 13. In the illustrated embodiment, there are two mounts 54. In some installations only the mount 54 adjacent the tail lap portion 16 need be used, or the member 13 may be moulded with a single mount 54. In, for example, high wind loading and/or some wall cladding installations, both mounts 54 may be fitted with batten engagement portions. In FIG. 10, the mounts are shown with batten engagement portions 14 installed, in this case by adhesive fixing.

Lower stiffening webs 55 have a lower edge portion 56 adapted to bear on the bearing portion 24 of the batten 10.

The side overlap portion 47 and the side underlap portion 50 are each provided with complementary ridges 57 to aid in weatherproofing.

Figure 11:
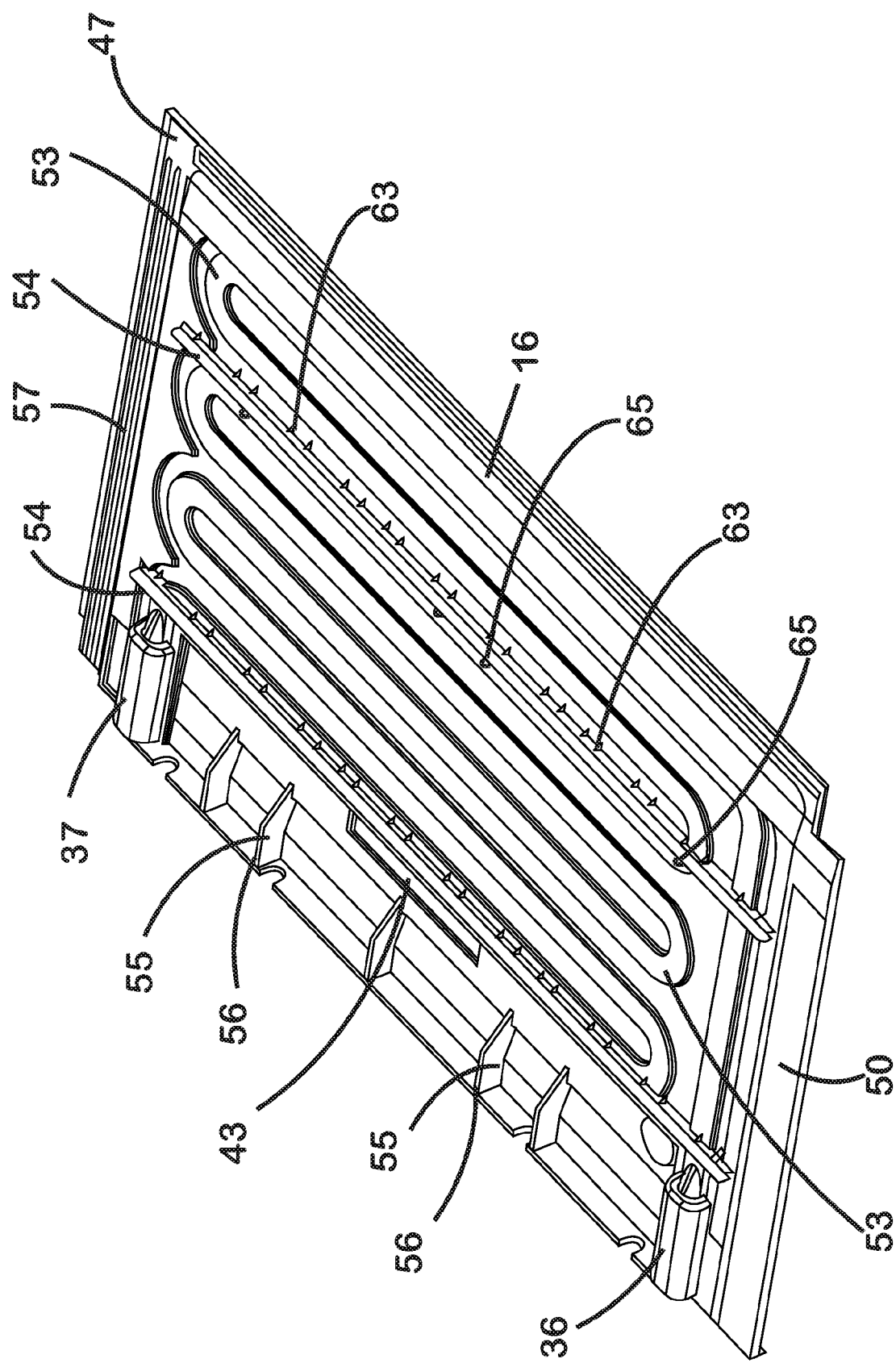
FIG. 11 is a bottom isometric view of the cladding member of FIG. 7, PV elements removed.

The batten engagement portions 14 are detailed in FIGS. 12 and 13. In this embodiment the batten engagement portions 14 are moulded as discrete members in fibre reinforced polymer, and are adhesively bonded to the batten engagement portion mounts 54 in use. The batten engagement portions 14 comprise an L-section portion 60 formed integrally with a U-section locating portion 61 adapted to engage the mounts 54. The U-section locating portion 61 may be provided with lateral locating slots 62 adapted to engage corresponding locating lugs 63 (see FIG. 11) associated with the batten engagement portion mounts 54. In the illustrated embodiment, there are two batten engagement portions 14 per batten engagement portion mount 54 with a gap there between, which provides for alternate installations where, for example, a roof truss member may pass.

The use of two batten engagement portion mounts 54 necessarily requires the use of batten engagement portions 14 of differing depth, since the batten engagement portion 14 at the tail lap portion 16 must be deeper than the batten engagement portion 14 at an intermediate location to accommodate entrapment of the head portion 12. Accordingly, to avoid errors in installation of the respective batten engagement portions 14, there may be provided discrete key slots 64 corresponding to discrete key lugs 65 formed at the respective batten engagement portion mount 54. These prevent the batten engagement portions 14 being mounted on the wrong batten engagement portion mount 54 as well as preventing the batten engagement portions 14 being mounted backwards on the batten engagement portion mount 54. The L-section is braced by a plurality in integral bracing webs 66. It can be seen that the batten engagement portion of FIG. 12 is an optional intermediate portion with one discrete key slot 64 whereas FIG. 13 illustrates the necessary batten engagement portion 14 with two discrete key slots 64.

Figure 14:
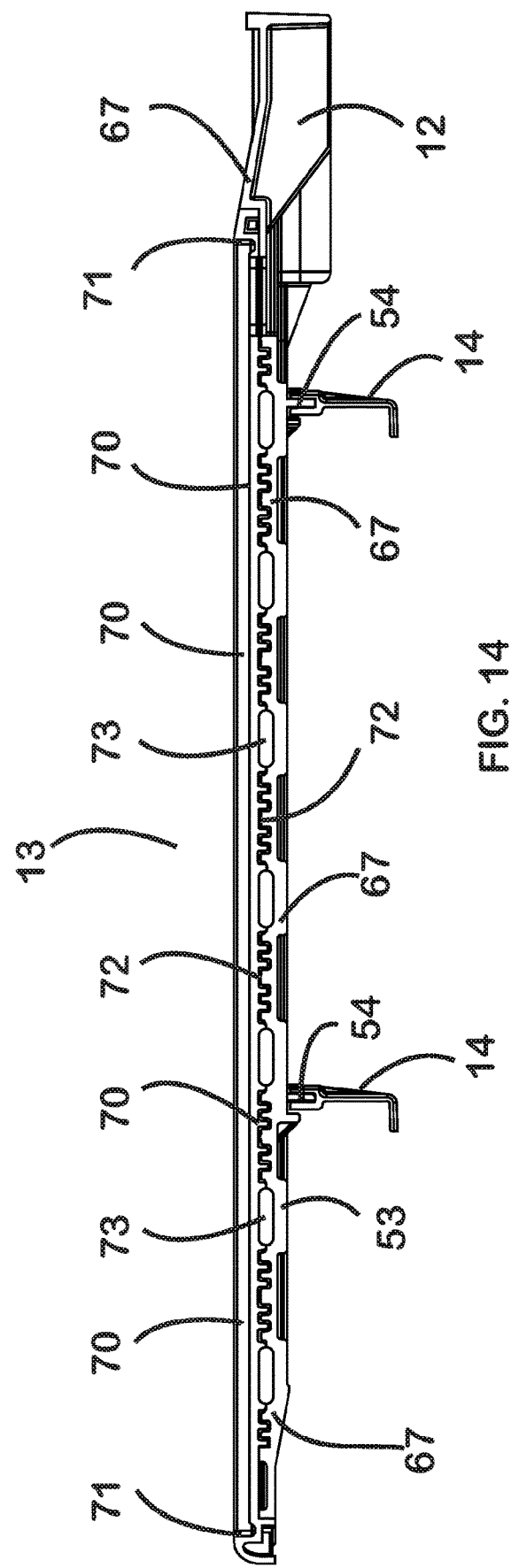
FIG. 14 is a longitudinal, vertical section through the cladding member of FIG. 7; section detail of the cladding member of FIG. 7.

FIG. 14 is a detail section through the embodiment described above. The cladding member 13 is shown to be formed of a supporting body portion 67 which includes the batten engagement portion mounts 54, the head portion 12, and the flattened sigmoidal ridge 53, and an absorber surface body portion 70 having a peripheral boundary wall 71 defining a shallow recess into which is thermally bonded the solar cell 44 array (removed in this view for clarity).

The supporting body portion 67 and absorber surface body portion 70 are each moulded in polymer composite. In this example, a thermosetting SMC comprising polyvinyl ester matrix with about 30% E-glass fibre reinforcing of 25 mm strand length, about 40% aluminium trihydrate fire retardant filler material and carbon black pigment, is pressure moulded with heating to cure.

The respective mouldings have complementary bonding portions 72 forming a glue line in assembly. Between the bonding portions 72 the mouldings have complementary water passage portions formed which, in assembly for a water passage 73.

Figure 15:
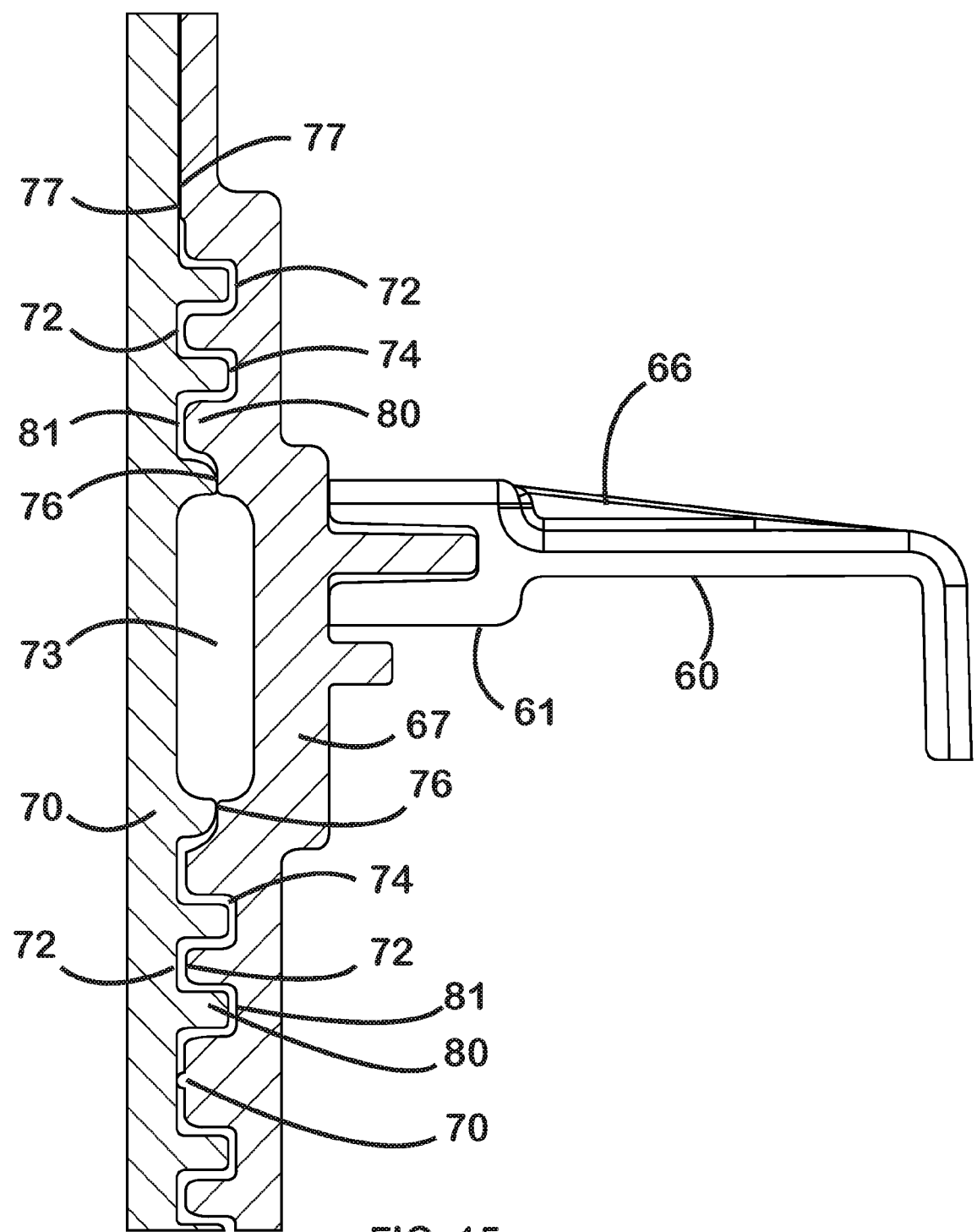
FIG. 15 is a detail of the section of FIG. 14.

As seen in more detail in FIG. 15, the bonding portions 72 define in assembly a glue space 74, the dimension of which is maintained at optimum for a methacrylate adhesive composition by a spacer nib 75, water passage glue space nip 76 and bonding portion boundary 77.

Figure 16:
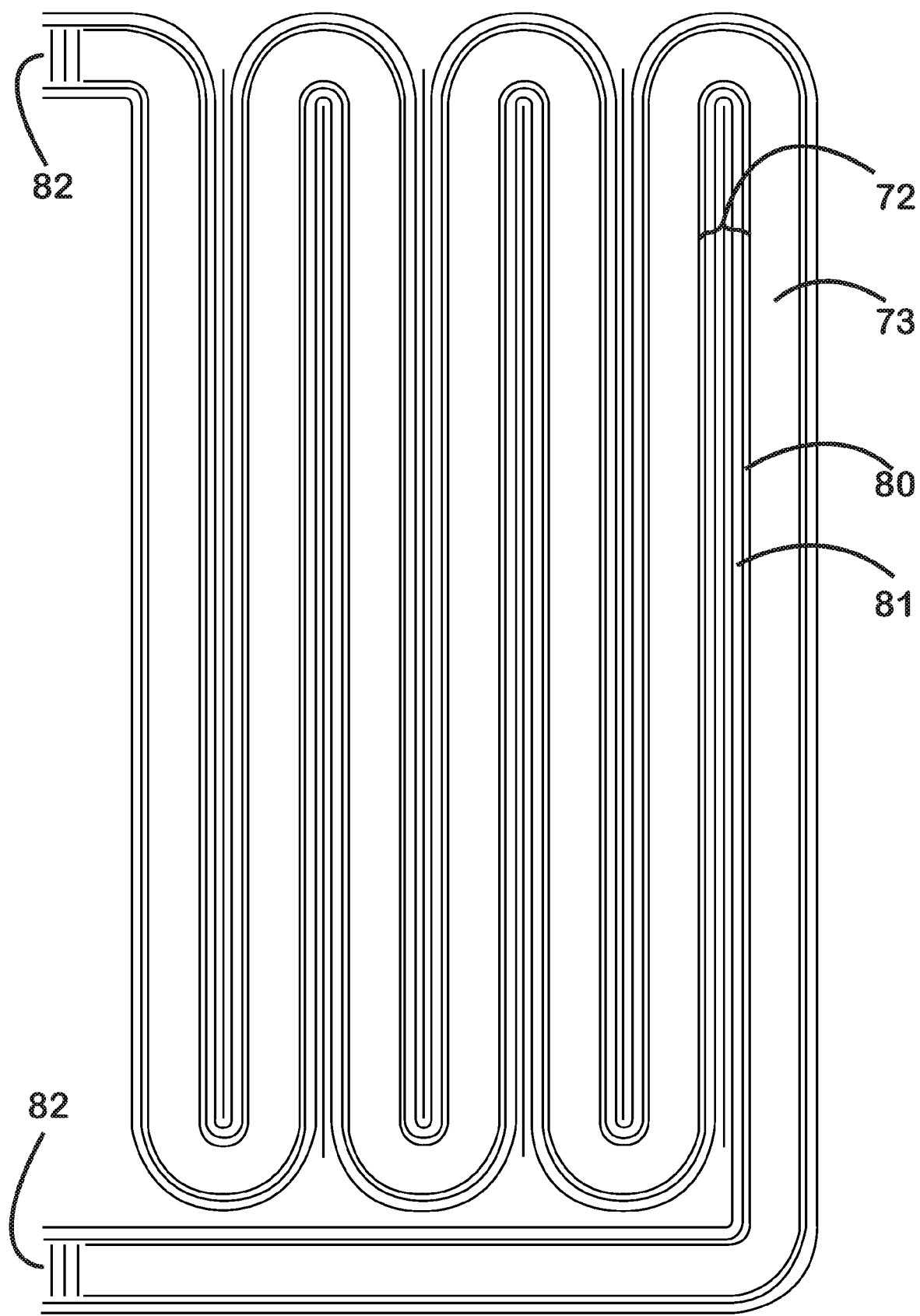
FIG. 16 is a diagram of a serpentine bond-defined water channel as embodied in the cladding member of FIG. 7.

The bonding portions 72 contrive a glue space 74 that is longer that the transverse sectional dimension of the boding portions 72 by being formed of a plurality of complementary ridges 80 and grooves 81. In FIG. 16 there is a scheme of the bonding portion 72 illustrating the water passage 73 portion, the ridges 80 and grooves 81, and the insertion points 82 for the water inlet 36 and outlet 37 assemblies.

The bonding process involves surface preparation of the bonding portions 72 by way of sanding to remove surface contaminants and roughen the surface to allow better 'keying' of the adhesive into the material. Precision is maintained by using a CNC machine and adhesive dispensing machine to control the positioning of and exact quantity of two-pack methacrylate adhesive applied to the parts. The components are brought together and a force applied to hold the parts together under pressure during the cure time of the adhesive.

Figure 17:
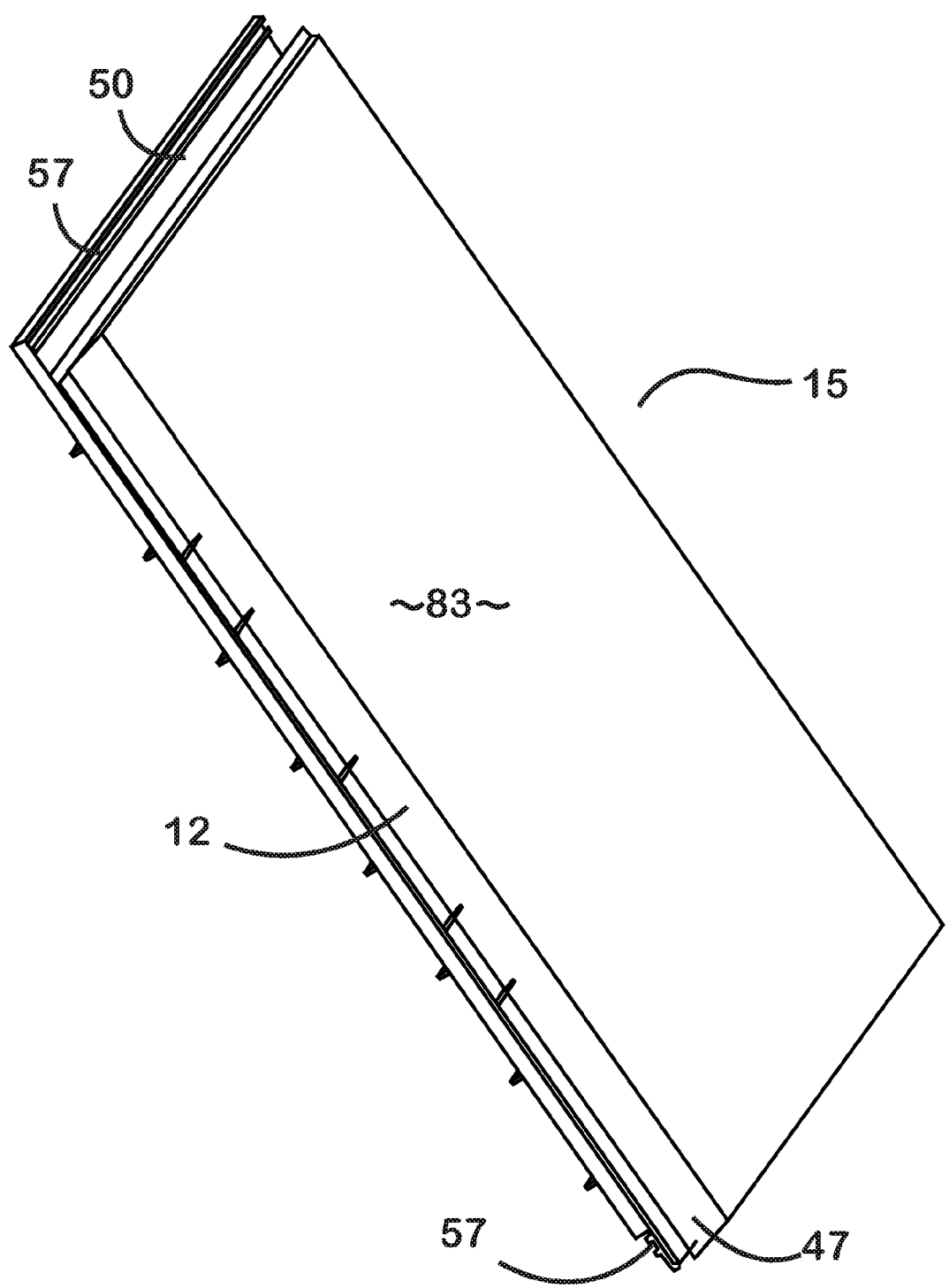
FIG. 17 is a top isometric view of an alternate cladding member.

In FIG. 17 there is illustrated a plain cladding member 15 comprising a unitary moulding of vinyl ester thermoset composite material as described above. In keeping with the intent of integration with the active members 13, there is provided a head portion 12, and side overlap portion 47 and side underlap portion 50, both with complementary ridges 57. The composite is protected by a paint system to provide colour and UV protection. In the present example the plain top surface 83 is coated in a UV-resistant 2-pack polyurethane finish.

Figure 18:
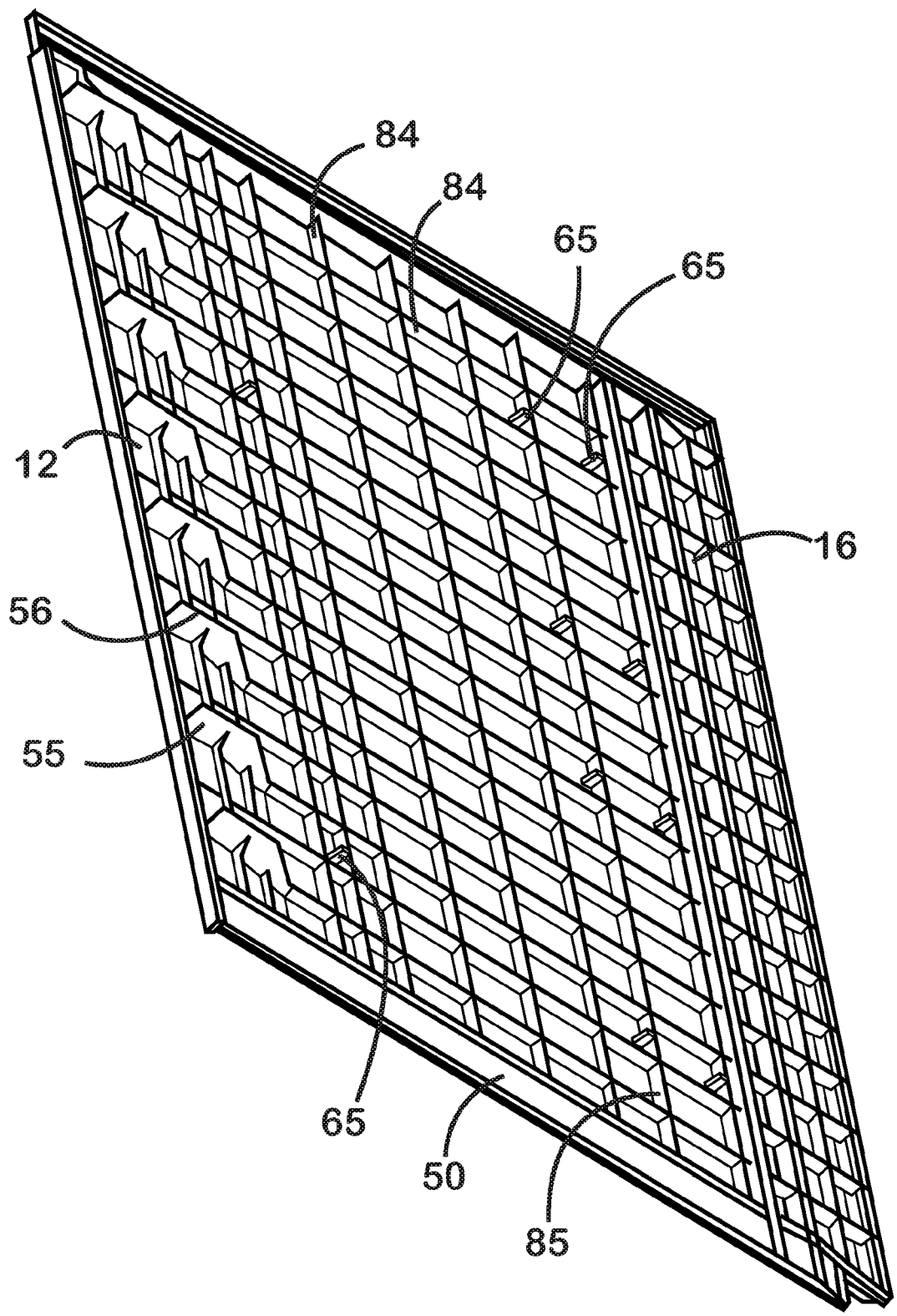
FIG. 18 is a bottom isometric view of the cladding member of FIG. 17, without batten engagement members.

FIG. 18 is a bottom isometric view of the underside of the member of FIG. 17. This illustration shows that the top surface is braced below by an egg-crate array of webs 84.

The head portion 12 and the tail lap portion 16 are braced by closer spacing of the webs 84 in those regions. The webs 84 are configured in the head space to form lower edge portions 56 for bearing on the batten bearing surface 24 and/or upper flange surface 17, analogous to the stiffening webs 55 of FIG. 11. Similarly, the webs 84 are specialized to form the integral batten engagement portion mounts 54 with their attendant discrete key lugs 65. In addition, there is provided an alternate lower batten engagement portion mount 85, provided to allow for setting back of the batten 10 on the structure adjacent to the gutter or facia thereof, as will become apparent hereinafter.

Figure 19:
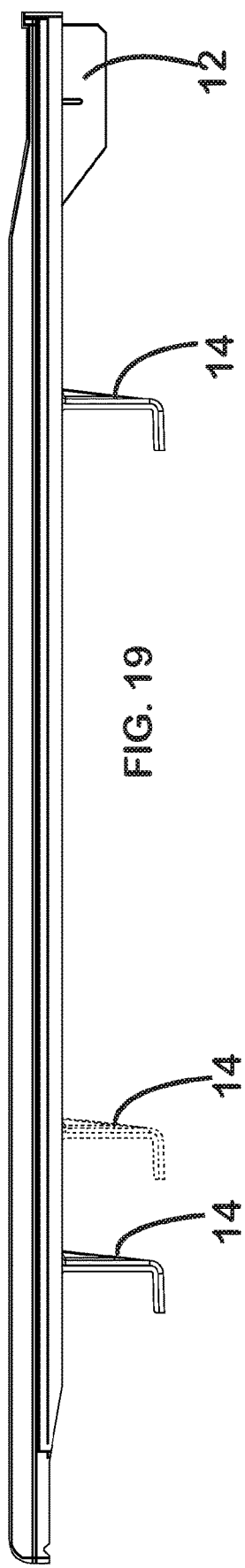
FIG. 19 is a side view of the cladding member of FIG. 17, showing alternate mounting positions of lower batten engagement member, and an optional upper batten engagement member.
Figure 20:
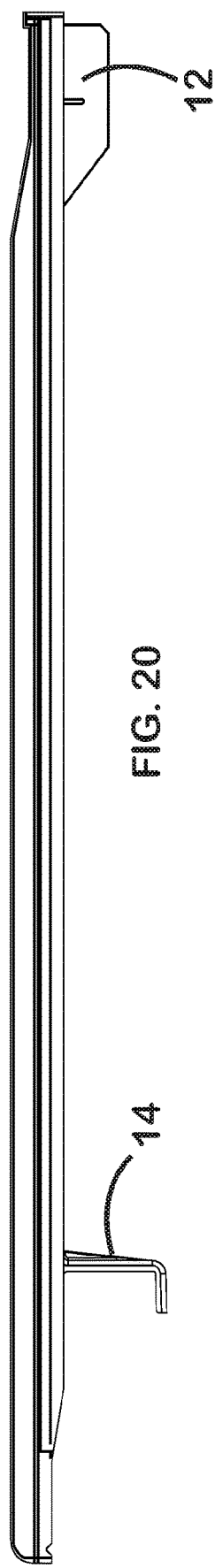
FIG. 20 is a side view of the cladding member of FIG. 17, showing a conventional positioning of a single batten engagement member.

FIGS. 19 and 20 are side views of the plain cladding member 15, wherein FIG. 19 is the double-batten engagement portion embodiment and FIG. 20 is the single batten engagement portion embodiment. Particularly, FIG. 19 illustrates the alternate location of the lower batten engagement portion 14 described above.

Figure 21:
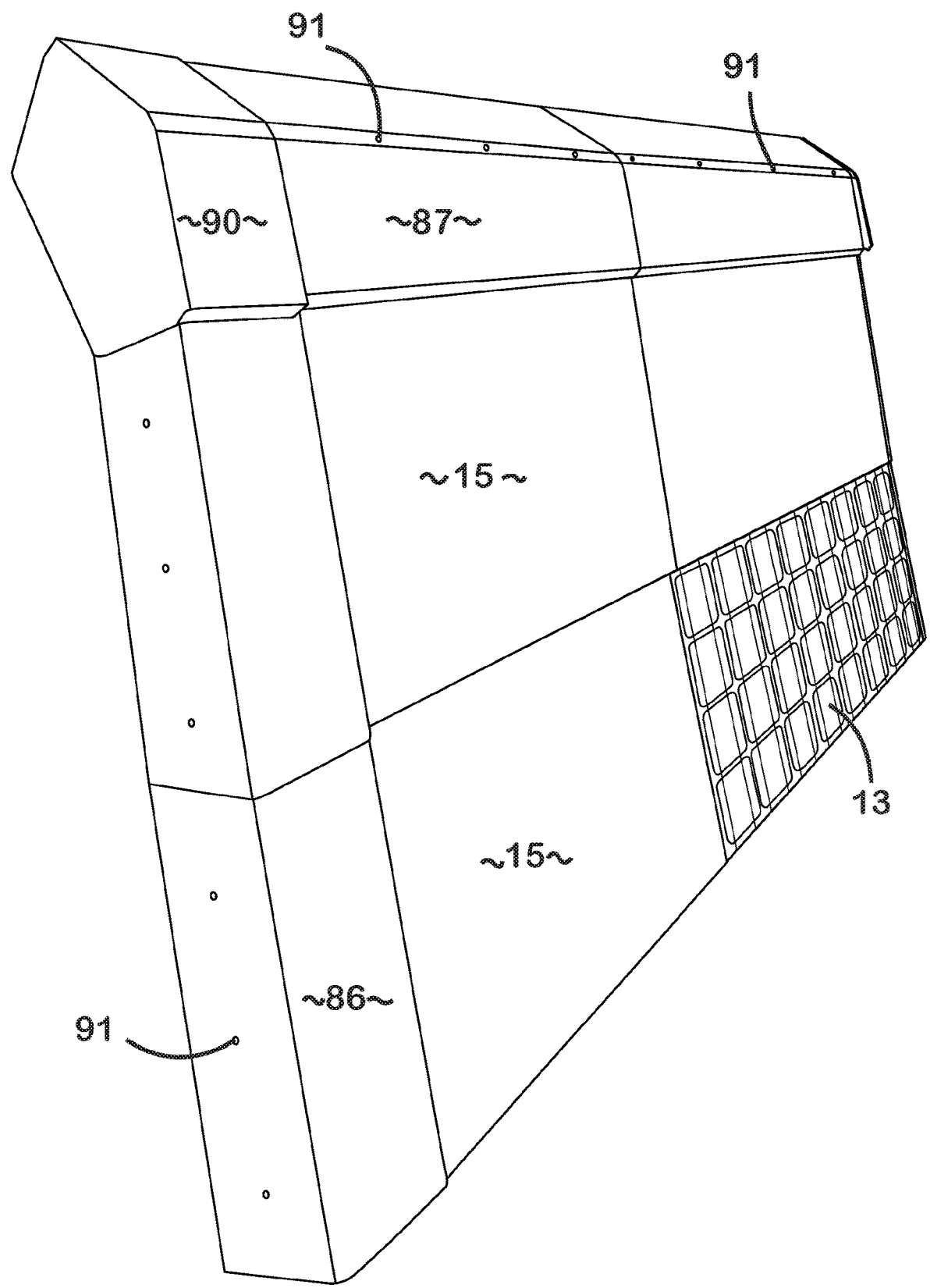
FIG. 21 is an isometric detail view of barging, ridge and end capping for use in the cladding system of FIG. 1.

In FIG. 21, there is a generalized pictorial view of an installation of plain 15 and solar thermal/PV 13 cladding members, showing their use with barge capping 86, ridge capping 87 and end caps 90. Self-coloured and sealing screw fixings 91 are used.

Figure 22:
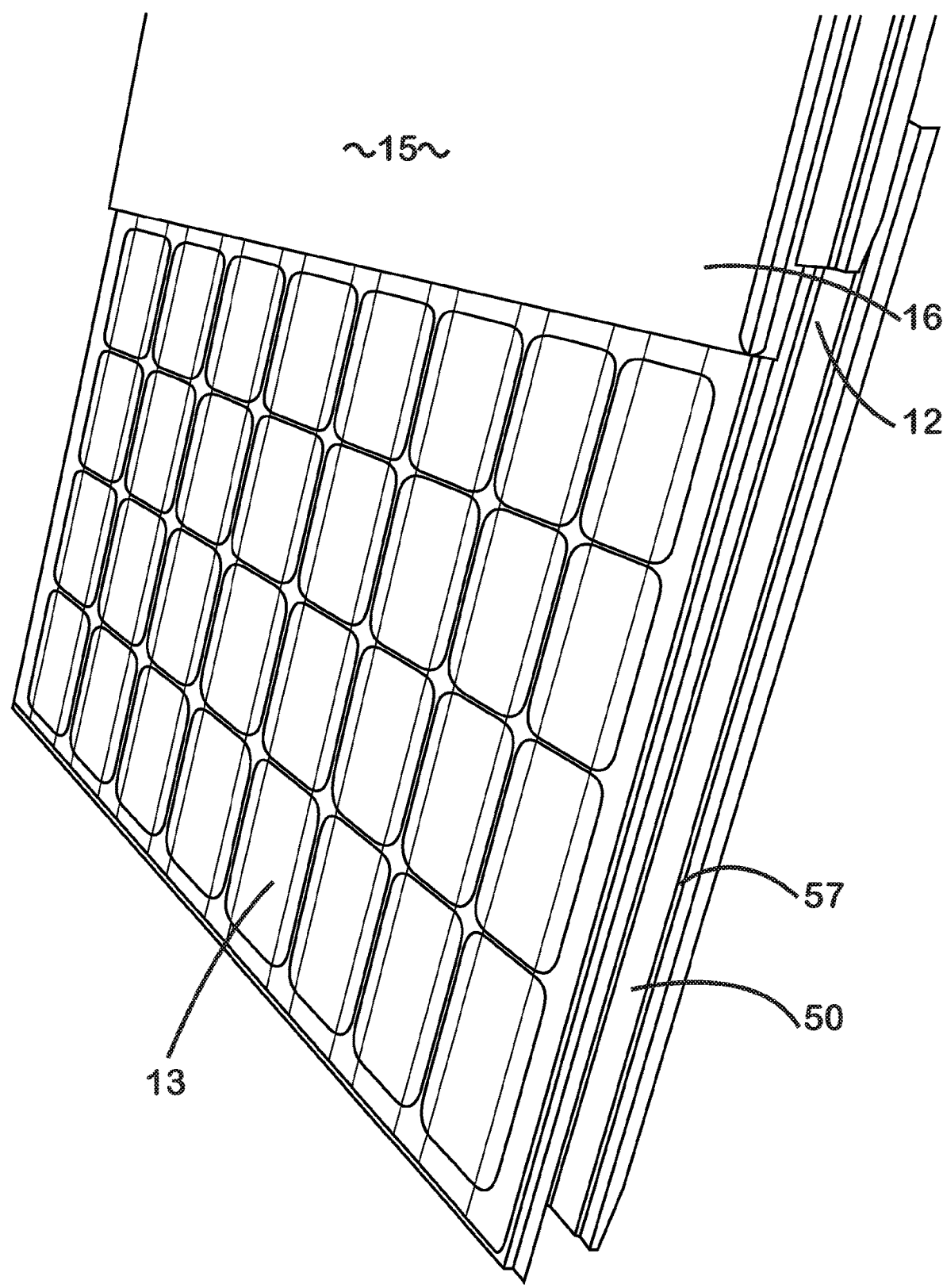
FIG. 22 is an isometric detail view of the edge lapping of cladding members used in the system of FIG. 1.
Figure 23:
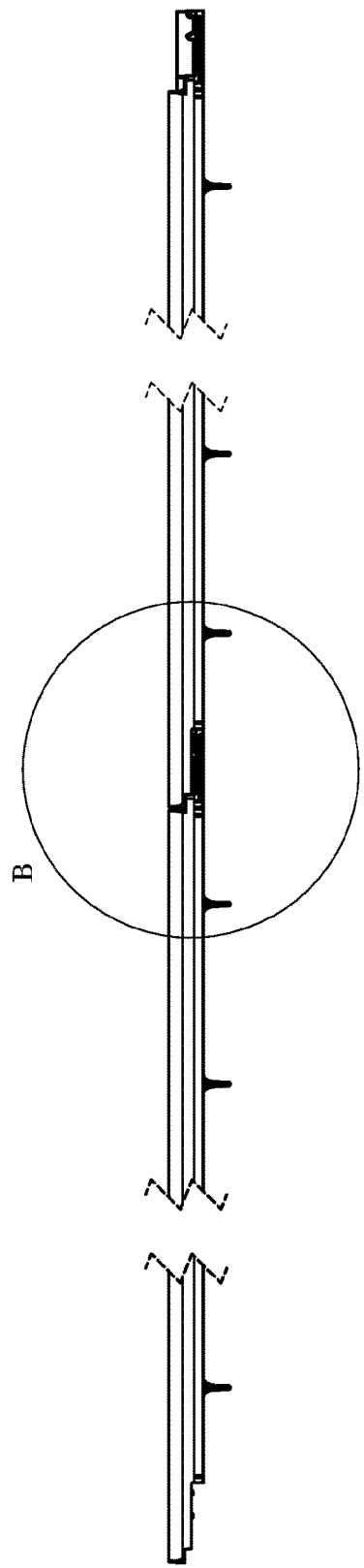
FIG. 23 is a section through the head/tail overlap of a flush-fitting alternative cladding member, indicating Detail B.
Figure 24:
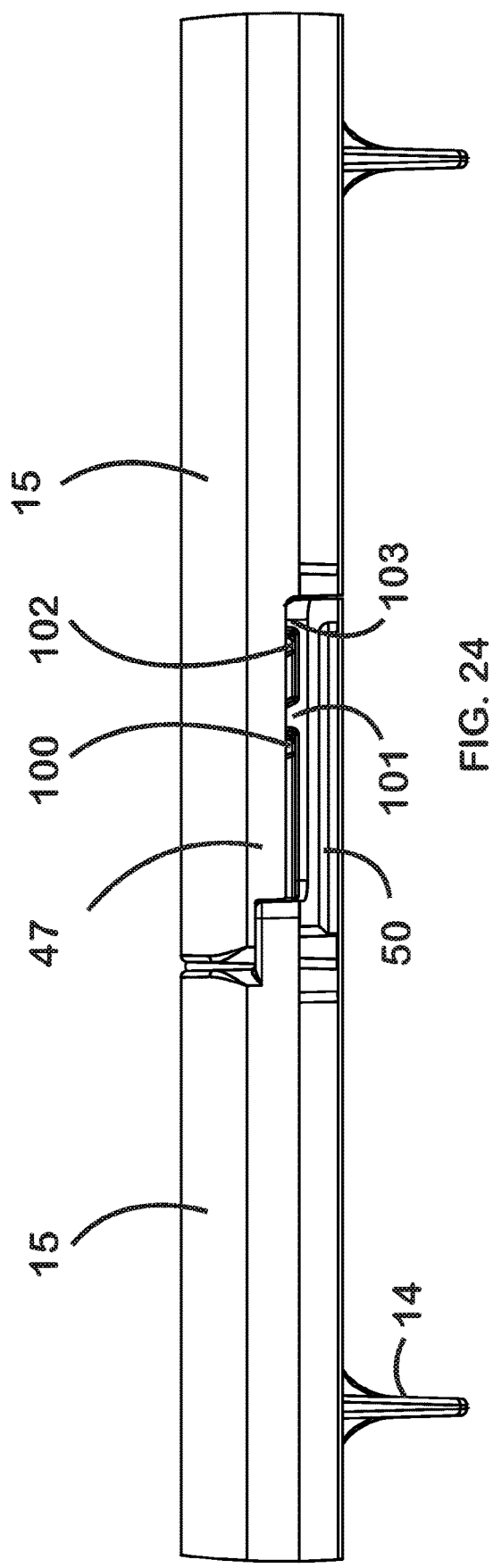
FIG. 24 is a detail of the head/tail overlap Detail B of FIG. 23.
Figure 25:
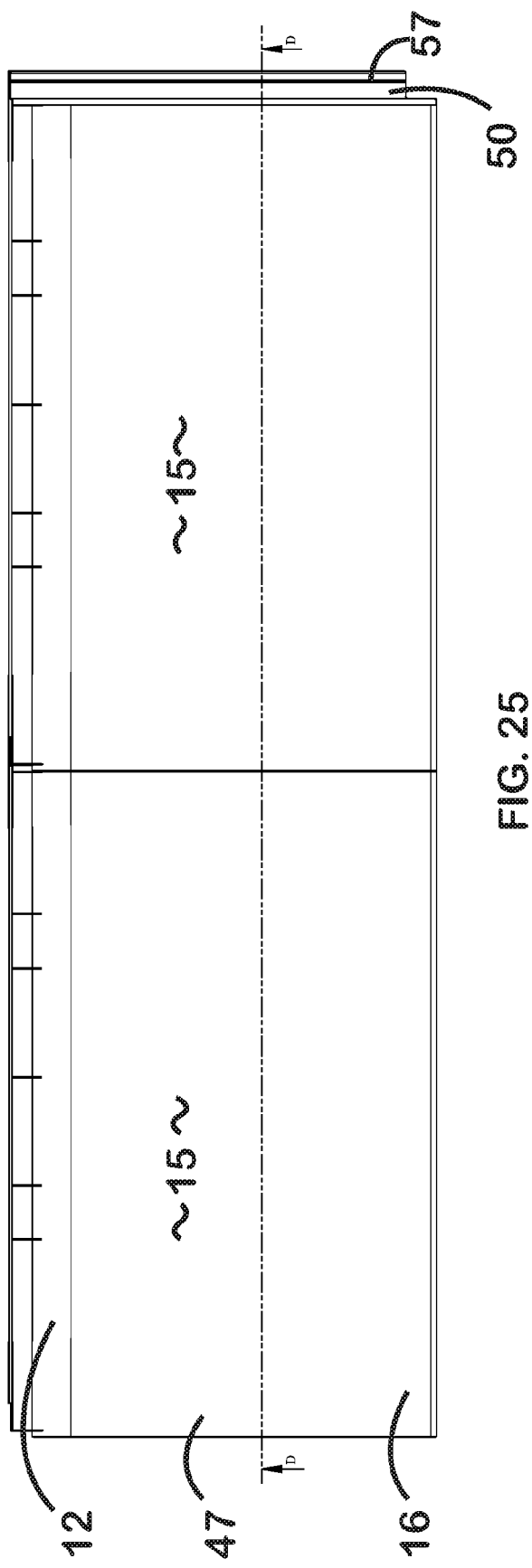
FIG. 25 is an assembly of two cladding members according to FIG. 23, and showing a section line D-D thereon.
Figure 26:
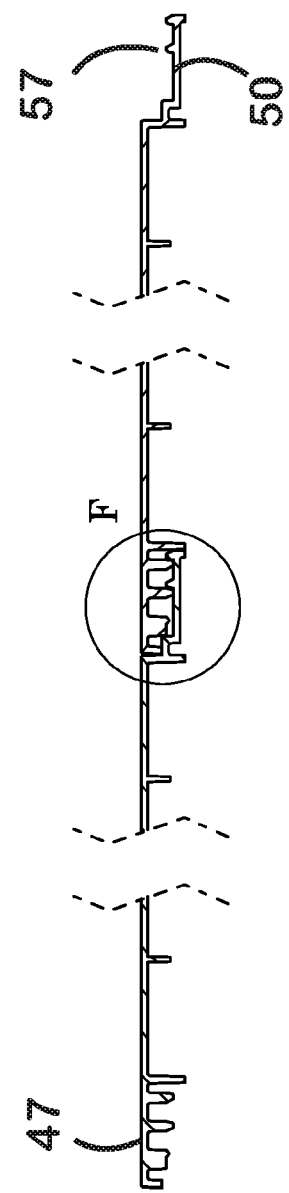
FIG. 26 is the section D-D corresponding to the assembly of FIG. 25 and indicating Detail F.
Figure 27:
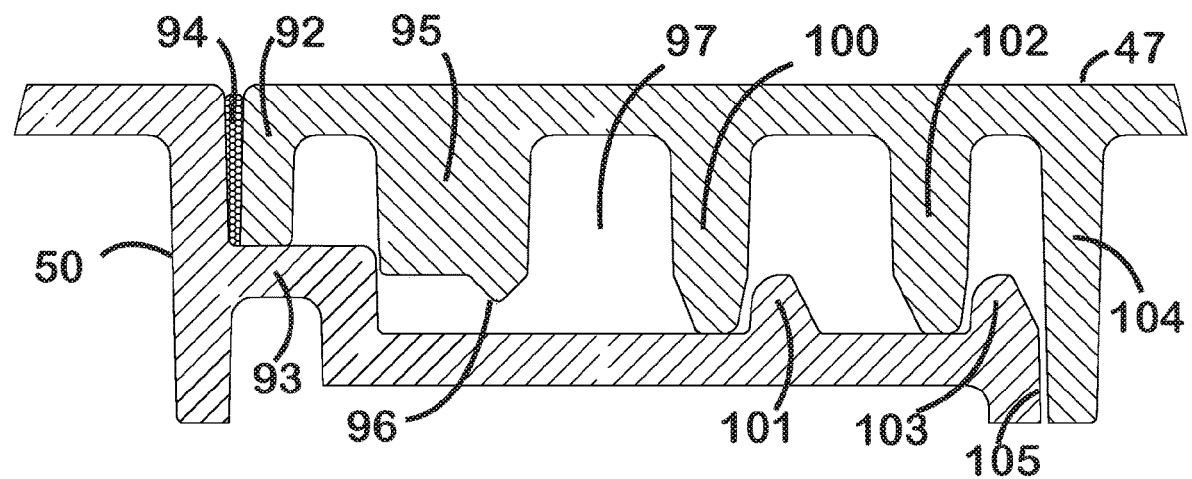
FIG. 27 is the Detail F.

FIG. 22 is a close detail of the lapped portions of a solar thermal PV member 13 and plain cladding member 15

FIGS. 23 to 27 goes to the detail of the side overlap 47 and underlap 50 portions of the members 13, 15 as they are laid in a course on a structure. In this embodiment, the complementary ridges 57 comprise, on the overlap portion, an outer bearing ridge 92 adapted to bear on a land portion 93 of the adjacent underlap 50. portions. In this embodiment, there is a sealant bond 94 introduced between the members 13 or 15 at this outer bearing ridge 92. Spaced inwardly of the outer bearing ridge is a drip line ridge 95 defining a drip line 96. The drip line 96 resides in a space 97 that is essentially closed at its inner boundary by a dam ridge 100 which bears on the underlap 50. The space 97 captures any casual ingress and conveys it downslope to drain.

Inward of the dam ridge 100 and integrally formed on the underlap is a labyrinth ridge 101 to form therewith a first labyrinth portion. A second dam ridge 102 and second labyrinth ridge 103 inward of the first labyrinth portion forms a second labyrinth portion. The inner terminus of the side join is formed by an inner ridge 104 closing over the terminal edge 105 of the underlap 50.

Figure 28:
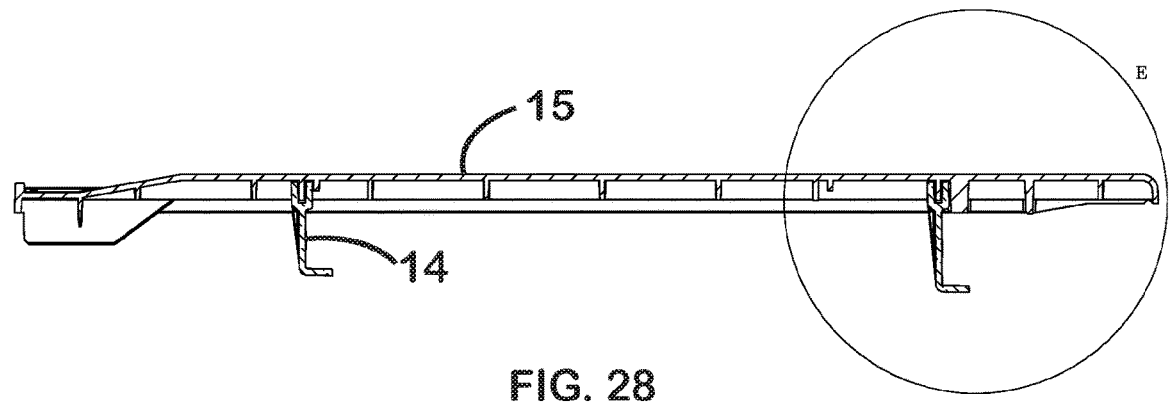
FIG. 28 is a longitudinal, vertical section through an alternative PV-only cladding member, indicating Detail E.
Figure 29:
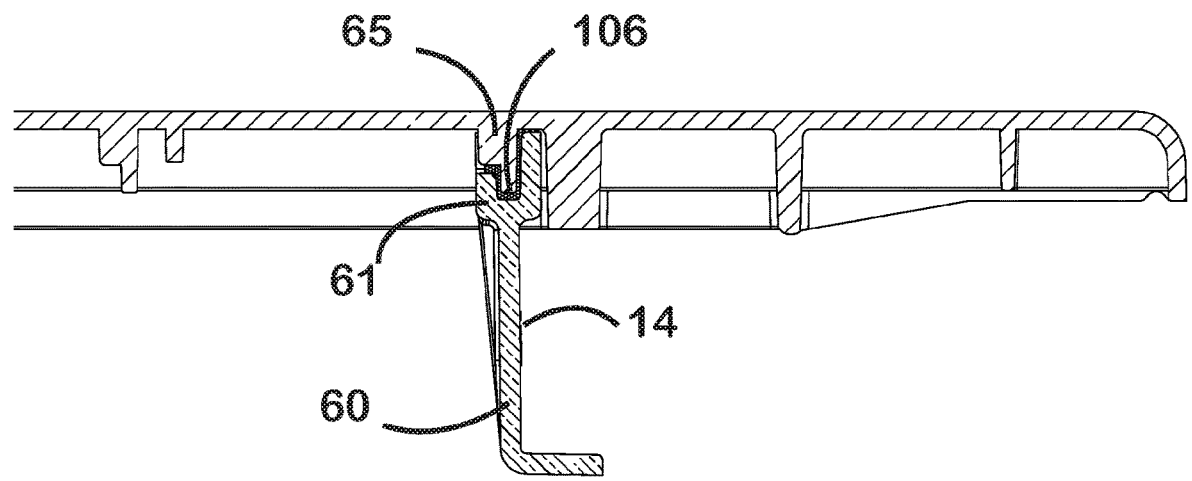
FIG. 29 is the Detail E.

FIGS. 28 and 29 are side section and detail views respectively of the cladding member 15, illustrating the detail of attachment of the batten engagement portions 14. In the section of FIG. 28, the U-section 61 of the batten engagement portion 14 is shown in its engagement with the batten engagement portion mount 54, in both the tail lap and intermediate positions. In the detail of FIG. 29, the section is taken through the batten engagement portion at the location of the discrete key lug 65. The glue line allowance 106 is also shown in this detail.

Figure 30:
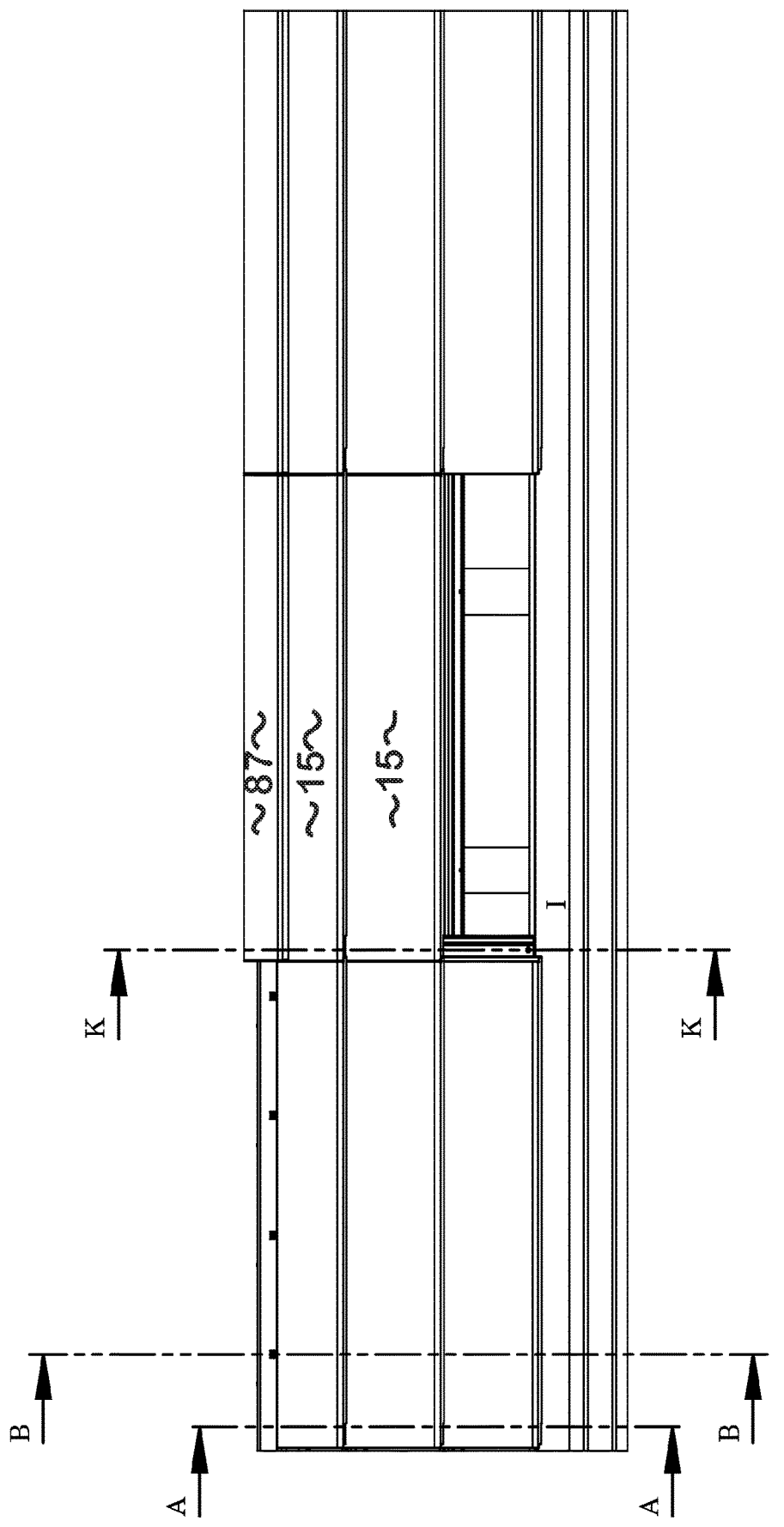
FIG. 30 is a course of the cladding members of FIG. 28, in a course.

FIGS. 30 to 40 are a sequence illustrating the installation of cladding members 15 in a model having a ridge batten 107 and a fascia 110, interconnected by a roof truss portion 111. FIG. 30 shows an array of cladding apparatus 15 (one missing for clarity) and ridge capping 87 (one missing for clarity) according to the present invention and indicating the sections A-A (FIG. 32), B-B (FIG. 36) and K-K (FIG. 38).

Figure 31:
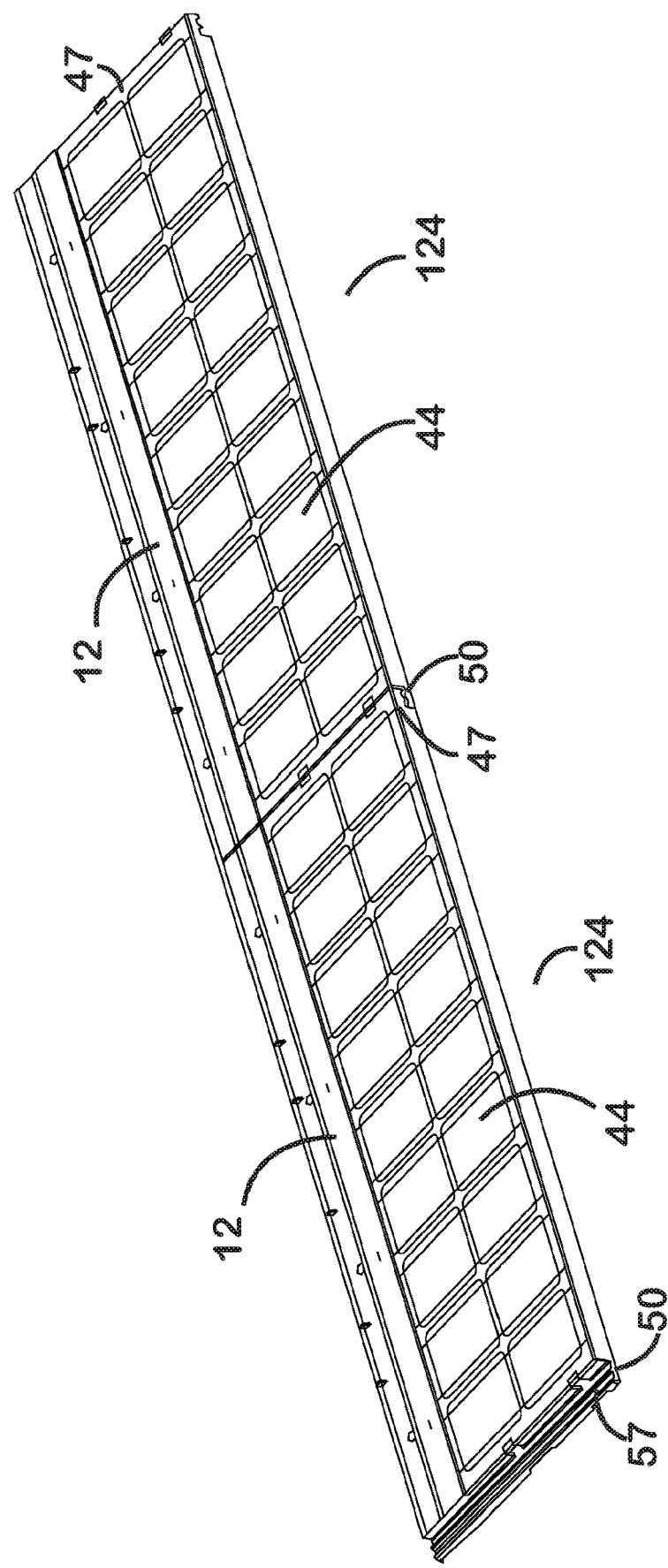
FIG. 31 is a pair of solar PV cladding members for use with the members of FIG. 28 in a cladding system.

FIG. 31 is an assembly of two solar PV-only apparatus sized to integrate with standard roofing elements and having a polymer composite cladding body 124 having a head portion 12, side overlap portion 47, side underlap portion 50 and complementary ridges 57 as per conventional roofing elements. The solar PV connections are to the underside of the element. The solar cells 44 are bonded to a recess in the surface as described in the context of FIG. 14 above.

FIG. 32 is a cross section view of the middle plane of the roof's outside truss portion 111. For the purposes of the model, four battens 10 are installed on the trusses by double batten screws 112 at each truss 111. The detail of the topmost batten 10 are provided in FIG. 33. The detail of the fascia adjacent batten 10 is given in FIG. 43. The detail of all battens there between is given in FIG. 44.

FIG. 33 shows the arrangement of the batten 10 adjacent the ridge batten 107. The batten 10 is located intermediate of the head and tail portions of an ordinary plain cladding member 15, in this case trimmed to meet the ridge batten 107. As there is no packing thickness of head portion, and to control the pitch of the member 15, it is necessary to install a spacer 113 between the cladding member underside and the batten 10.

Retaining screw 114 is driven through the spacer 113 and batten 10 and into the truss 111 before fitting off the last cladding member 15. The ridge capping 87 in this embodiment is laid over a flexible flashing 115 glued to the top cladding members 15 on each side of the ridge. Batten screw recesses 116 are formed in the ridge capping 87 to enable a batten screw fixing 117 to secure the ridge capping 87 to the ridge batten 107.

FIG. 34 shows the arrangement of the batten 10 adjacent the fascia 110. As the tail lap portion 16 of this first row of cladding members 15 is not supported on the batten 10 via the head portion 12 of a next adjacent row, it is necessary to install a spacer 120, in this case secured by batten screw 121 through the batten 10 and into the truss portion 111. Thereafter the cladding member is retained against lifting by the batten engagement portion 14 hooking under the upslope-directed upper flange 17 of the batten 10.

Figure 35:
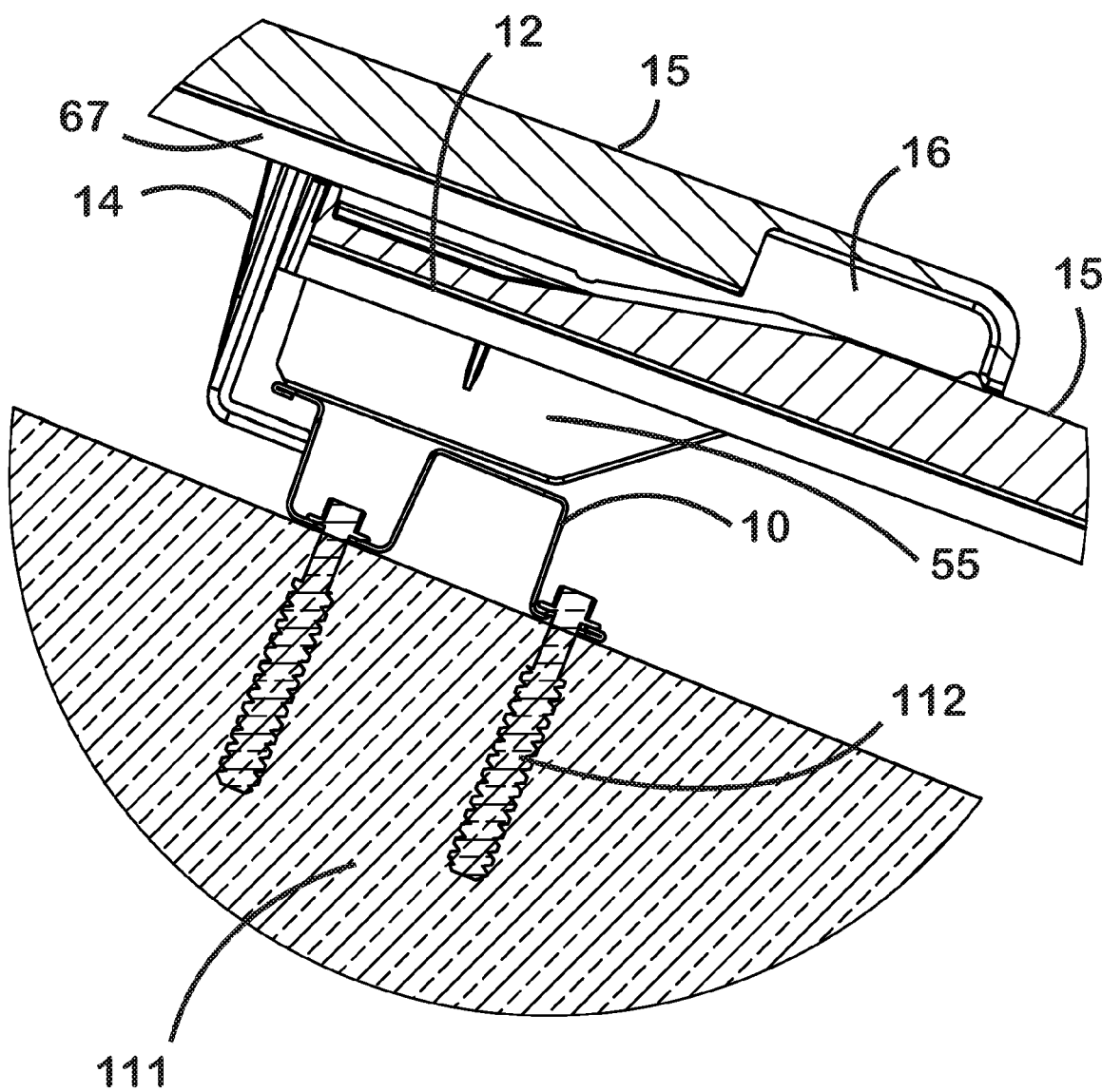
FIG. 35 is the Detail D of FIG. 32.

FIG. 35 represents the detail of all other batten fixings, that is, neither at the ridge or fascia. The structure, function and purpose of the components are describes herein before.

Figure 36:
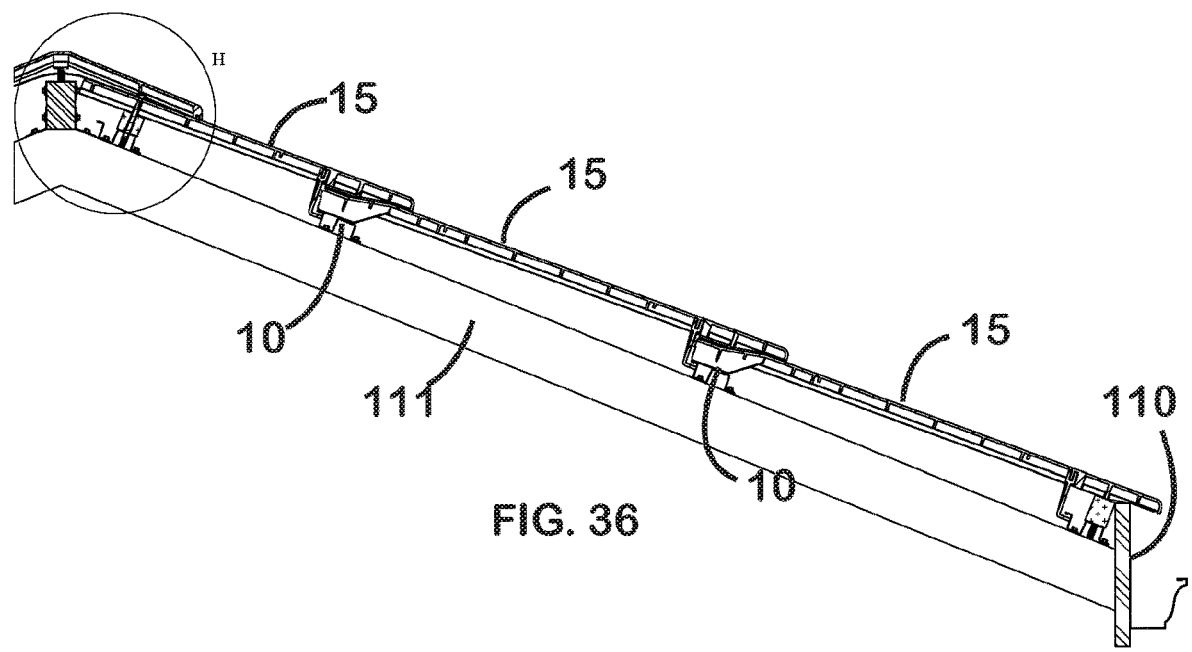
FIG. 36 is a section through a roof cladding illustrating the installation method using the cladding members of FIG. 28 and indicating Detail H.
Figure 37:
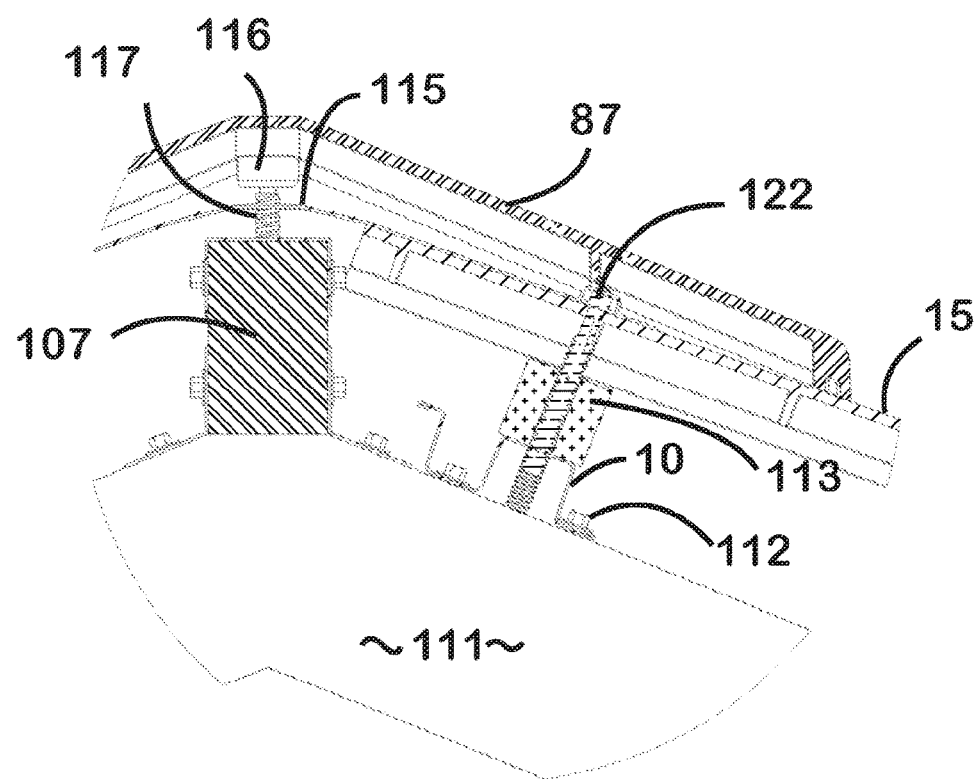
FIG. 37 is the Detail H of FIG. 36.

FIGS. 36 and 37 shows an alternate arrangement of the batten 10 adjacent the ridge batten 107. As the batten location is substantially beneath the ridge capping 87, it is possible to drive a batten screw 122 though the cladding member 15, spacer 113 batten 10 and into the truss 111, in lieu of the screw 114 of FIG. 33.

FIGS. 38 to 40 are a cross section view of the plane K-K where a screw 123 passes through the side underlap portion 50, spacer 120 and the batten 10 and into the truss 111 to secure the cladding member 15. This is possible without leaking because the screw head is overlaid by the side overlap portion 47 of the next adjacent cladding member 15.

Figure 41:
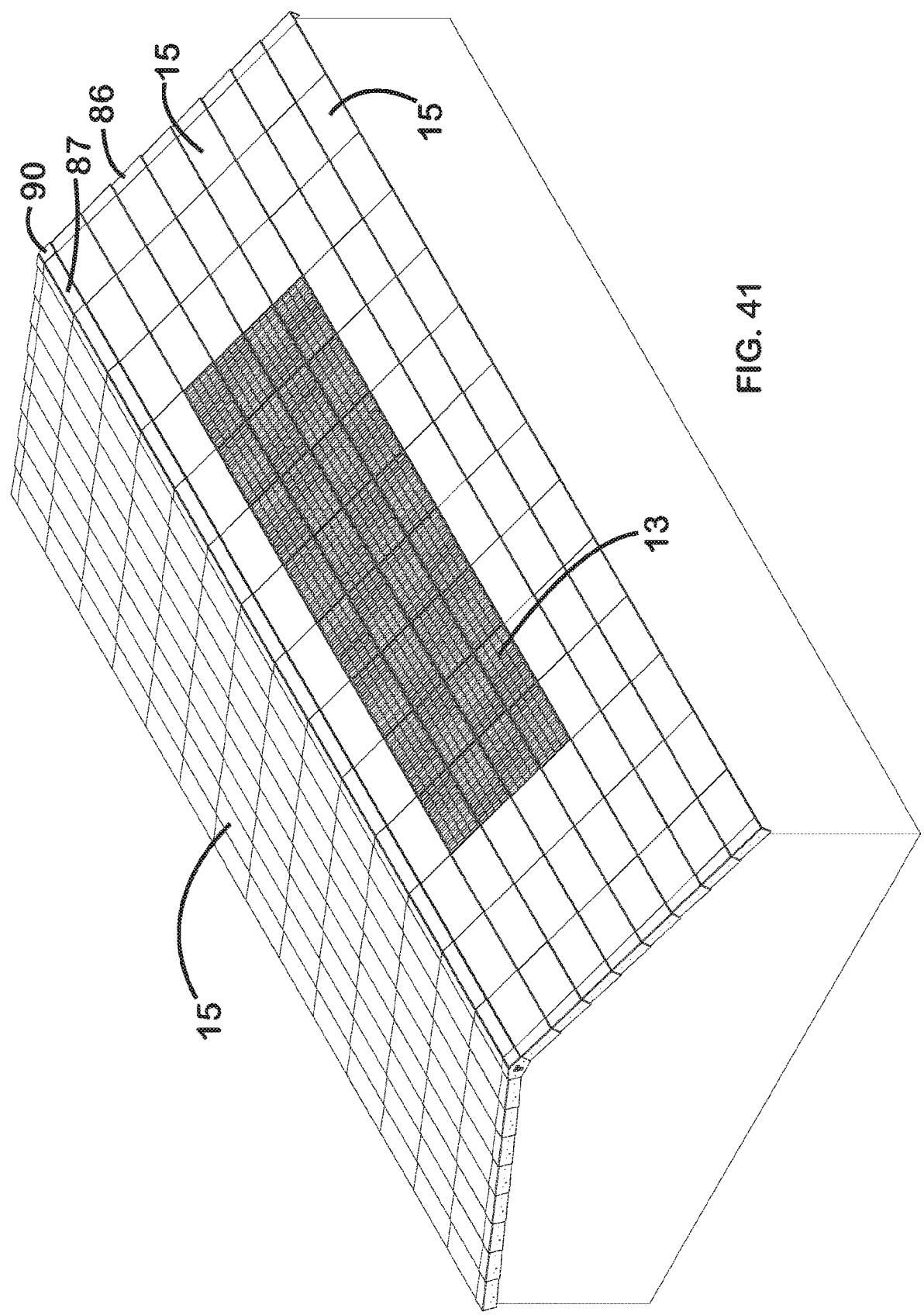
FIG. 41 is an overall artistic impression of a roof cladding as envisaged for the present invention.

FIG. 41 is an overall impression of a complete roof in accordance with the present invention.

It will be recognised by persons skilled in the art that numerous variations and modifications may be made to the invention as broadly described herein without departing from the spirit and scope of the invention as described herein and defined in the claims appended hereto.

The invention claimed is:

1. A solar thermal collector of the type including a collector body having an absorber surface adapted to be exposed to sunlight and be heated thereby and a having a liquid flow passage there though adjacent said absorber surface, characterized in that said collector body is formed of body portions of material selected from polymer and polymer composite and adhesively bonded together at two or more sets of complementary bonding surface portions with spaces between said sets, a substantially continuous said liquid flow passage being defined in adjacent surfaces of said body portions in said spaces, said liquid flow passages being of a flattened cross section, whereby the transverse cross section of the flow passage has a dimension parallel to the absorber surface greater than the dimension perpendicular to the absorber surface passage in a ratio of not less than 3:1 parallel dimension:perpendicular dimension, said bonding surface portions having complementary surface profiles selected to provide a bond section across said bonding portion which is longer than the width of said bonding surface portion.

2. A solar thermal collector according to claim 1, wherein the collector body is formed of two complementary said body portions.

3. A solar thermal collector according to claim 1, wherein the body portions comprise a supporting body portion adapted to be mounted on a structure and an absorber surface body portion.

4. A solar thermal collector according to claim 1, wherein the liquid flow passage comprises a continuous sigmoidal flow passage extending from an inlet assembly to an outlet assembly, said inlet and outlet assemblies being adapted to connect the liquid flow passage to a coolant circuit.

5. A solar thermal collector according to claim 1, wherein the passage cross section is formed in part in each of the body portions.

6. A solar thermal collector according to claim 1, wherein the polymer body portions are pressure formed from sheet moulding compound selected from vinyl ester, polyester, epoxy, and phenolic composite.

7. A solar thermal collector according to claim 6, wherein the moulding compound is a vinyl ester composite including fibreglass.

8. A solar thermal collector according to claim 7, wherein the moulding compound further includes one or more of fillers, flame retardants, pigments and shrinkage control additives.

9. A solar thermal collector according to claim 1, wherein the surface profile of the bonding portion comprises a plurality of parallel ridges and grooves adapted to form a labyrinth in which a bonding material acts to join the parts.

10. A solar thermal collector according to claim 9, wherein the surface profile includes contact points between the body portions selected to maintain optimum bond thickness for the bonding material.

11. A solar thermal collector according to claim 9, wherein the parallel ridges and grooves are oriented substantially parallel to the flow direction in the passages.

12. A solar thermal collector according to claim 9, wherein the substantially parallel ridges and grooves form a polysinusoidal section.

13. A solar thermal collector according to claim 1, wherein the bonding material is an adhesive system selected from solvent free epoxy, polyurethane, acrylic and silicone systems.

14. A solar thermal collector according to claim 13, wherein the adhesive system comprises two-pack methacrylate adhesive.

15. A solar thermal collector according to claim 1, wherein the inlet and outlet assemblies comprise inlet and outlet fittings located in respective complementary inlet and outlet mounting portions formed at a part line between said body portions, said inlet and outlet fittings being bonded in their respective mounting portions as the body portions are bonded together.

16. A solar thermal collector according to claim 15, wherein the inlet and outlet assemblies are configured with quick fit and release pipe connections.

17. A solar thermal collector according to claim 1, wherein the absorber surface has bonded thereto one or more solar PV elements.

18. A solar thermal collector according to claim 1 and including:
respective head and foot portions integrally formed at opposed edges of the collector body, the foot portion cooperating in substantially weatherproof overlap with the head portion of one or more other collector bodies installed on a structure, said head and foot portions being interconnected by respective one of opposed, complementary side edges of said collector body and forming therewith a cladding body, said complementary side edges providing substantially weatherproof interengagement between said cladding body and an adjacent said cladding body secured to said battens, one said side edge of said body overlapping a said side edge of said adjacent body and selected to finish said adjacent bodies to a substantially flush surface in use on said structure;
mounting means on an underside of said cladding body and adapted to secure said cladding body to battens on said structure; and
inlet and outlet fluid connectors bonded between said body portions and fluid-connecting said passage into an external heat exchange fluid circuit.

19. A solar thermal collector according to claim 18, wherein the head and foot portions and side edge portions are formed of polymer composite.

20. A solar thermal collector according to claim 19, wherein the head and foot portions and the side edge portions are integral with one of the collector body portions.

21. A solar thermal collector according to claim 18, wherein the substantially weatherproof overlap of the respective head and tail portions is supplemented by labyrinth elements provided on one or both of the portions.

22. A solar thermal collector according to claim 19, wherein the complementary side edges comprise interengaging ridges and grooves to form a labyrinth seal.

23. A solar thermal collector according to claim 18, wherein the complementary side edges include in assembly a resilient sealing strip.

24. A solar thermal collector according to claim 18, wherein one or both of the head and foot portions includes a hollow space in which one or both of the inlet and outlet connectors are led.

25. A solar thermal collector according to claim 24, wherein hollow space is in a said head portion which is open to the underside or inside of the structure, whereby the inlet and outlet connectors may be accessed after the cladding is installed.

26. A solar thermal collector according to claim 18, wherein the mounting means comprises substantially L-shaped members associated with the foot portion and adapted in use to pass under the batten, trapping the head portion of the next adjacent cladding body resting on the batten.

27. A solar thermal collector according to claim 26, wherein the batten comprises an elongate roll formed metal or polymer composite section having a pair of upper bearing surfaces and a pair of lower bearing surfaces, each pair of bearing surfaces being formed by a peripheral flange and the floor of a channel.

28. A solar thermal collector according to claim 27, wherein the one or both of the upper bearing surfaces is provided with dimples or perforations to resist foot slip.

29. A solar thermal collector according to claim 27, wherein the upper surface of one or more of the lower bearing portions is provided with a screw location groove or dimple to permit the battens to be screwed to the rafters or studs.

30. A solar thermal collector according to claim 27, wherein the batten is stiffened by dimpling side edges of floor of the rolled section.

31. A solar thermal collector according to claim 26, wherein the L-shaped members comprise batten engagement portion or portions integrally formed with or secured to the underside of the cladding body in the region of the foot portion, and adapted in use engage the batten with the bar of the L-shape under the peripheral flange, whereby the foot portion traps the head portion of the next adjacent cladding body against the upper surfaces of the batten.

32. A solar thermal collector according to claim 18, wherein the absorber surface has bonded thereto one or more solar PV elements.

33. A solar thermal collector according to claim 32, wherein the absorber surface is recessed into its body portion to seat a solar array comprising at least a protective glass outer layer, an array of solar cells and conductive collectors, an insulative film backing and connection means providing termination for said collectors.

34. A solar thermal collector according to claim 24, wherein the upper surface of the cladding body adjacent the head portion is relieved to receive one or both of an encapsulated lead out and diode pack and allow the lead out to pass into the space inside the head space.

35. A solar thermal collector according to claim 4, wherein the coolant circuit includes adjacent solar thermal collectors.

* * * * *